(12) United States Patent
Aoki

(10) Patent No.: US 7,924,601 B2
(45) Date of Patent: Apr. 12, 2011

(54) RESISTIVE MEMORY AND DATA WRITE-IN METHOD

(75) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 71 days.

(21) Appl. No.: 12/561,797

(22) Filed: Sep. 17, 2009

(65) Prior Publication Data

US 2010/0157655 A1   Jun. 24, 2010

Related U.S. Application Data

(63) Continuation of application No. PCT/JP2007/056712, filed on Mar. 28, 2007.

(51) Int. Cl.
   *G11C 11/00* (2006.01)
(52) U.S. Cl. .................................... 365/148; 365/163
(58) Field of Classification Search .................. 365/148, 365/163, 158, 189.2
   See application file for complete search history.

(56) References Cited

U.S. PATENT DOCUMENTS

| 6,785,185 B2 | 8/2004 | Sumitani et al. | |
|---|---|---|---|
| 7,330,369 B2 * | 2/2008 | Tran | 365/151 |
| 2003/0002377 A1 | 1/2003 | Sumitani et al. | |
| 2005/0117388 A1 * | 6/2005 | Cho et al. | 365/163 |
| 2008/0170428 A1 | 7/2008 | Kinoshita | |

FOREIGN PATENT DOCUMENTS

| JP | 04-033029 A | 2/1992 |
|---|---|---|
| JP | 11-306073 A | 11/1999 |
| JP | 2000-003596 A | 1/2000 |
| JP | 2003-015954 A | 1/2003 |
| WO | 2007/023569 A1 | 3/2007 |

OTHER PUBLICATIONS

Notification of Transmittal of Translation of the International Preliminary Report on Patentability (Forms PCT/IB/338) of International Application No. PCT/JP2007/056712 mailed Oct. 29, 2009 with Forms PCT/IB/373 and PCT/ISA/237.
I. G. Baek et al, "Highly Scalable Non-volatile Resistive Memory using Simple Binary Oxide Driven as Asymmetric Unipolar Voltage Pulses," Technology Digest International Electron Devices Meeting, 2004, pp. 587-590.
International Search Report of PCT/JP2007/056712, mailing date of Jan. 8, 2008.

* cited by examiner

*Primary Examiner* — Vu A Le
(74) *Attorney, Agent, or Firm* — Westerman, Hattori, Daniels & Adrian, LLP

(57) ABSTRACT

An ReRAM of the present invention includes a high speed write-in region and a main memory region, only memory cells designated to have the storage state out of the memory cells corresponded to data are set to the storage state in the high speed write-in region. The data written in the memory cell array are transferred to the main memory region, the memory cells of the memory cell array corresponded to the data transferred from the high speed write-in region are reset to the no-storage state in the main memory region, only the memory cells designated to have the storage state out of the memory cells are set, and all memory cells are reset to the no-storage state, or the initial state, in the high speed write-in region.

16 Claims, 21 Drawing Sheets

RESISTIVE MEMORY AND DATA WRITE-IN METHOD

CROSS REFERENCE TO RELATED APPLICATIONS

This application is a Continuation of International Application No. PCT/JP2007/056712, with an international filing date of Mar. 28, 2007, which designating the United States of America, the entire contents of which are incorporated herein by reference.

FIELD

The present invention relates to a resistive memory capable of storing data making use of changes in resistance induced by applied voltage, and of holding contents of memory even after being disconnected from a power source, and a method of data write-in using the same.

BACKGROUND

There has been a lot of demands on high speed data write-in into a semiconductor memory, by a single write-in command. Possible applications include allowing a semiconductor memory to be quickly written with and then holding the final state of memory when the memory is powered off; and reducing the duration of time necessary for write-in of adjustment data, ID data and so forth when the semiconductor memories are shipped. In these applications, data write-in is conducted by a single command, wherein the data having the same address will not be re-written throughout the period.

In the conventional semiconductor memories, any high speed data write-in needed a system configuration in which the data are once written in a high speed memory such as SRAM, and then transferred to a flash memory or the like (for example, see Japanese Laid-Open Patent Publication No. 2003-15954, Japanese Laid-Open Patent Publication No. 11-306073, and Japanese Laid-Open Patent Publication No. 4-33029.

SUMMARY

At present, non-volatile resistive memory (Resistive Random Access Memory: ReRAM), having resistive elements and highly compatible with CMOS memory and so forth have been under development.

Even if the ReRAM were adopted to the semiconductor memory, there has still been a need of configuring a system by which data are once written in a high speed memory such as SRAM, and then transferred to the ReRAM, because any conventional ReRAM are incapable of allowing high speed write-in solely by itself.

As described in the above, even if the ReRAM were used, the high speed write-in may be realized only with at least one additional semiconductor memory, inevitably raising a problem of increase in the device size, and complication of the device configuration.

According to the present invention, there is provided a resistive memory which stores data making use of changes in resistance induced by applied voltage, which includes: a first memory region having a first memory cell array having a plurality of resistive elements arranged therein; and a second memory region having a second memory cell array having a plurality of resistive elements arranged therein, wherein in the resistive elements, a high resistance state being defined as a no-storage state, and a low resistance state lower than the high resistance state being defined as a storage state, wherein in the process of data write-in, the first memory region is set to the initial state in which all resistive elements in the first memory cell array reset to the no-storage state, and sequentially executes therein a first operation setting only resistive elements designated to have the storage state out of the resistive elements corresponded to the data to a storage state; a second operation transferring the data written in the first memory cell array to the second memory region; and a third operation resetting all resistive elements to the no-storage state after the data transfer operation, so as to attain the initial state, and the second memory region executes therein a fourth operation resetting the resistive elements in the second memory cell array corresponded to the data transferred from the first memory region to the no-storage state, and then setting only resistive elements out of the resistive elements designated to have the storage state to the storage state.

According to another embodiment of the present invention, there is provided a resistive memory storing data making use of changes in resistance induced by applied voltage, and contains a memory cell array having a plurality of resistive elements arranged therein, wherein in the resistive elements, a high resistance state being defined as a no-storage state, and a low resistance state lower than the high resistance state being defined as a storage state, wherein in the process of data write-in, all resistive elements of the memory cell array are reset to a no-storage state, or the initial state, and executes therein a setting operation setting only resistive elements designated to have the storage state out of the resistive elements corresponded to the data to the storage state; and a resetting operation resetting all resistive elements to the no-storage state, or the initial state.

According to another embodiment of the present invention, there is provided a resistive memory which stores data making use of changes in resistance induced by applied voltage, and contains a memory cell array having a plurality of resistive elements arranged therein, the memory cell array having a plurality of first element blocks each having a plurality of resistive elements arranged therein, and a plurality of second element blocks each having a plurality of resistive elements arranged therein, wherein in the resistive element, a high resistance state being defined as a no-storage state, and a low resistance state lower than the high resistance state being defined as a storage state, wherein in the process of data write-in, the first element block is set to the initial state in which all resistive elements in the first memory cell array reset to the no-storage state, and executes therein a setting operation setting only resistive elements designated to have the storage state out of the resistive elements corresponded to the data to the storage state; and a resetting operation resetting all resistive elements to the no-storage state, or the initial state.

According to the present invention, there is provided a method of using a resistive memory which stores data making use of changes in resistance induced by applied voltage, and contains a first memory region having a first memory cell array having a plurality of resistive elements arranged therein, and a second memory region having a second memory cell array having a plurality of resistive elements arranged therein, wherein in the resistive element, a high resistance state being defined as a no-storage state, and a low resistance state lower than the high resistance state being defined as a storage state, wherein in the process of data write-in, in the first memory region, all resistive elements of the first memory cell array are reset to a no-storage state, or the initial state, and the method is configured to execute: a first step setting, in the first memory region, only resistive elements designated to have the storage state out of the resistive elements corresponded to the data to the storage state; a second step transferring, in the first memory region, the data written in the first memory cell array to the second memory region; a third step resetting, in the second memory region, the resistive elements of the second memory cell array corresponded to the data transferred from the first memory region to the no-storage state, and then setting only resistive elements designated to have the storage state out of the resistive elements to the storage state; and a fourth step resetting, in the first memory region, all resistive elements to the no-storage state, or the initial state.

According to another embodiment of the present invention, there is provided a method of using a resistive memory which stores data making use of changes in resistance induced by applied voltage, and includes a memory cell array having a plurality of resistive elements arranged therein, wherein in the resistive element, a high resistance state being defined as a no-storage state, and a low resistance state lower than the high resistance state being defined as a storage state, wherein in the process of data write-in, all resistive elements of the memory cell array are reset to the no-storage state, or the initial state, and the method is configured to execute: a first step setting only resistive elements designated to have the storage-state out of the resistive elements corresponded to the data to the storage state; and a second step resetting all resistive elements to the no-storage state, or the initial state.

According to still another embodiment of the present invention, there is provided a method of using a resistive memory which stores data making use of changes in resistance induced by applied voltage, and contains a memory cell array having a plurality of first element blocks each having a plurality of resistive elements arranged therein, and a plurality of second element blocks each having a plurality of the resistive elements arranged therein, wherein in the resistive element, a high resistance state being defined as a no-storage state, and a low resistance state lower than the high resistance state being defined as a storage state, wherein in the process of data write-in, all resistive elements of the memory cell array are reset to the no-storage state, or the initial state, and the method is configured to execute: a first step setting only resistive elements corresponded to the data to the storage state; and a second step resetting all resistive elements to the no-storage state, or the initial state.

According to the present invention, a highly reliable resistive memory, capable of realizing a high speed data write-in function and a data holding function in a non-volatile manner solely by the ReRAM, without being combined with any additional memory chip such as SRAM, and also being adoptable to application in which high speed data write-in is conducted by a single write-in command, such as allowing a semiconductor memory to be quickly written with and then hold the final state of memory when the memory is powered off; and such as reducing the duration of time necessary for write-in of adjustment data, ID data and so forth when the semiconductor memories are shipped, may be realized.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Basic Concept of the Present Invention

Figure 1:
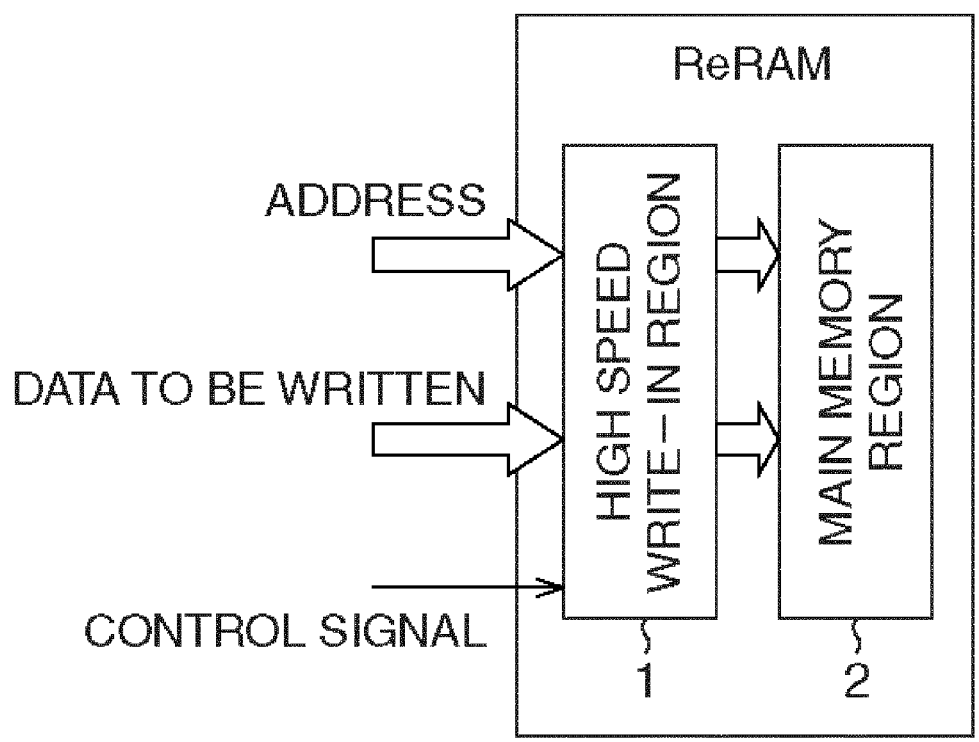
FIG. 1 is a block diagram schematically illustrating an overall configuration of an ReRAM according to a first embodiment.

In each resistive element of the ReRAM, a high resistance state allowing only a small current to flow is defined as the no-storage state represented by "0", and a low resistance state allowing a large current to flow is defined as the storage state represented by "1".

In an ReRAM, typically adopting a transition metal oxide, such as NiO, to a resistive layer which exhibits changes in resistance under applied voltage, a resetting operation (an operation for writing "0" into a resistive element) proceeds slower than a setting operation (an operation for writing "1" into a resistive element) (for example, see I. G. Baek, et al., Tech. Dig. International Electron Devices Meeting (IEDM) 2004, p. 587). More specifically, the setting operation takes approximately 10 ns and is allowed for high speed operation, whereas the resetting operation needs the order of microseconds and is not suitable for high speed operation.

The setting operation for the ReRAM may be enabled by applying a certain voltage not lower than the threshold value to the resistive element. Since the setting operation may be realized upon application of voltage not lower than a certain value, so that setting of only a lower value will suffice. For this reason, the write-in operation completes within a short time, only with a simple control without verification. In contrast, voltage to be applied in the resetting operation have the lower and upper values, wherein verification is necessary because too high applied voltage may cause setting, so that the write-in does not complete only within a single cycle of write-in operation.

In the present invention, an ReRAM configured as described below was configured, making use of the above-described characteristics of the ReRAM in the setting operation and the resetting operation.

The ReRAM is internally configured by a high speed write-in region (first memory region), and a main memory region (second memory region). The high speed write-in region is configured to have a first memory cell array having a plurality of resistive elements arranged therein, and the second memory region is configured to have a second memory cell array having a plurality of resistive elements arranged therein.

In the ReRAM, high speed data write-in is enabled by preliminarily resetting all resistive element of the first memory cell array in the high speed write-in region to the no-storage state, or the initial state, and by executing the setting operation, in the process of data write-in, setting only resistive elements designated to have the storage-state out of the resistive elements corresponded to the data to the storage state. Since the ReRAM is a non-volatile memory, and the data written in the high speed write-in region are therefore held after the ReRAM is powered off, so that the data written in the high speed write-in region are transferred to the main memory region when the ReRAM is not accessed by a CPU or the like. After the data transfer, the individual resistive elements in the high speed write-in region are reset to the initial state. In a general use, data are read out by accessing the main memory.

As described in the above, in the present invention, a high speed data write-in function and a data holding function in a non-volatile manner may be realized solely by the ReRAM, without being combined with any additional memory chip such as SRAM. The ReRAM of the present invention may be adoptable to application in which high speed data write-in is conducted by a single write-in command, such as allowing a semiconductor memory to be quickly written with and then hold the final state of memory when the memory is powered off; and such as reducing the duration of time necessary for write-in of adjustment data, ID data and so forth when the semiconductor memories are shipped.

PREFERRED EMBODIMENTS APPLIED WITH THE PRESENT INVENTION

Preferred embodiments applied with the present invention will be detailed below, referring to the attached drawings.

First Embodiment

Figure 2:
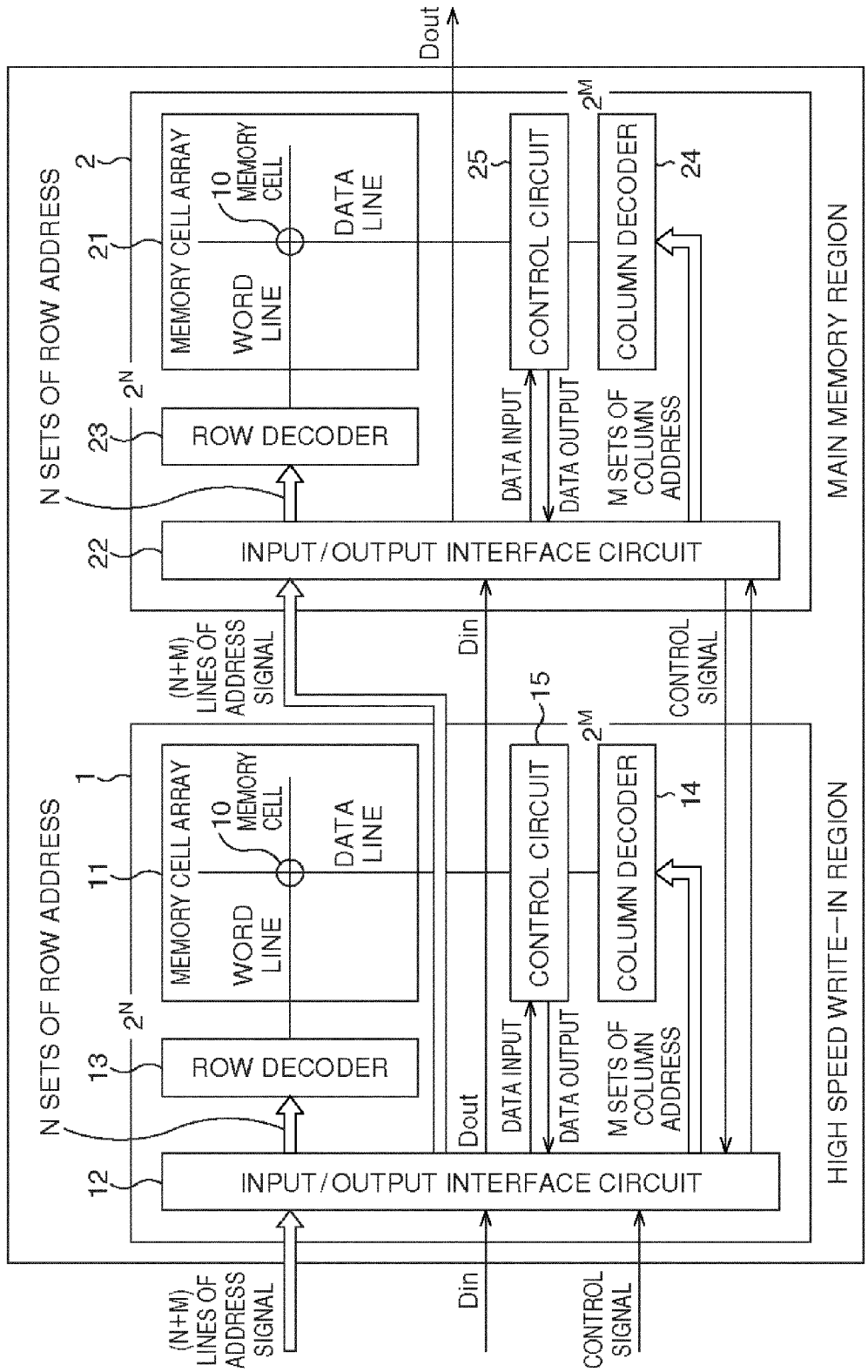
FIG. 2 is a block diagram specifically illustrating the individual memory regions of the ReRAM according to the first embodiment.
Figure 3:
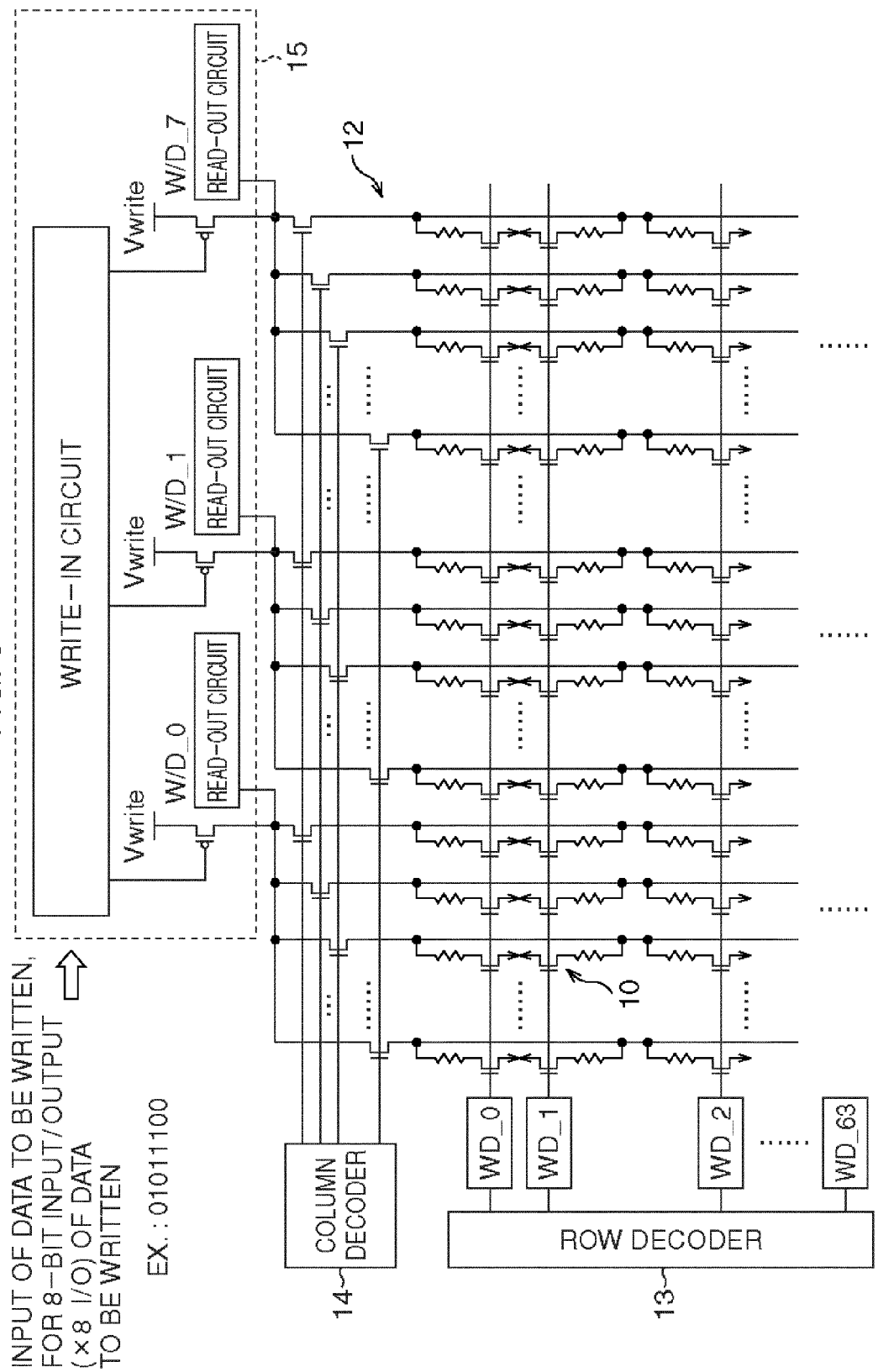
FIG. 3 is a wiring diagram specifically illustrating a configuration of a memory cell array.

FIG. 1 is a block diagram schematically illustrating an overall configuration of an ReRAM according to this embodiment, FIG. 2 is a block diagram specifically illustrating the individual memory regions of the ReRAM according to this embodiment, and FIG. 3 is a wiring diagram specifically illustrating a configuration of a memory cell array. This embodiment will exemplify a case where a single data string is composed of 8 bits. A series of write-in data is typically composed of three data strings.

The ReRAM is configured to have a high speed write-in region 1 mainly aimed at allowing therein high speed write-in, and a main memory region 2 which receives data transferred from the high speed write-in region 1, and allows the data to be appropriately read out therefrom in general use.

The high speed write-in region 1 is configured to have a memory cell array 11 having a plurality of memory cells 10, which are the resistive elements, arranged to form a matrix; an input/output interface circuit 12 allowed for various input/output; a row decoder 13 selecting predetermined word lines in the memory cell array 11; a column decoder 14 selecting predetermined data lines in the memory cell array 11; and a control circuit 15 conducting input/output of data of the memory cell array 11 with respect to the input/output interface circuit 12, so as to control a storage mode of the memory cell array 11.

The main memory region 2 is configured to have a memory cell array 21 having a plurality of memory cells 10, which are the resistive elements, arranged to form a matrix; an input/output interface circuit 22 allowed for various input/output; a row decoder 23 selecting predetermined word lines in the memory cell array 21; a column decoder 24 selecting predetermined data lines in the memory cell array 21; and a control circuit 25 controlling input/output of data to and from the memory cell array 21.

The memory cell arrays 11, 21 have, as illustrated in FIG. 3, a plurality of memory cells 10 arranged to form the matrices, have the same storage capacity, with an 1:1 correspondence of addresses (have the same address space). The memory cell arrays 11, 21 are connected through the word lines (WL) to the row decoders 13, 23, and connected through the data lines to the column decoders 14, 24, so that predetermined memory cells 10 are selectable by selecting predetermined word lines by the row decoders 13, 23, and by selecting predetermined data lines by the column decoders 14, 24.

The memory cell 10 is an element which exhibits changes in resistance in response to applied voltage, to which "0" or "1" is written making use of such changes in resistance. Transition metal oxide, such as NiO, may be adoptable as a resistive layer which exhibits changes in resistance under applied voltage. For example, a state of the resistive layer low in the resistance and therefore allows a large current to flow therethrough is defined as data "1", and high in the resistance and therefore allows only a small current to flow therethrough is defined as data "0". In this embodiment, an operation of writing "0" in the resistive element so as to turn it into the no-storage state is referred to as resetting operation, and an operation of writing "1" so as to turn it into the written storage state is referred to as setting state.

The control circuit 15 is typically configured, as illustrated in FIG. 3, to have a write-in circuit controlling the write-in operation to the memory cells 10 of the memory cell array 11, and a read-out circuit controlling the read-out operation. The control circuit 15 appropriately controls the operation for realizing a storage mode, designated by a control signal, of the memory cell 10 selected in the high speed write-in region 1, based on written data, address signals designating the memory cells, and a control signal designating a storage mode (set state and reset state described later) of the memory cell 10 of the memory cell array 11, all of which being input to the input/output interface circuit 12.

The control circuit 25 is typically configured to have a write-in circuit controlling the write-in operation to the memory cells 10 of the memory cell array 21, and a read-out circuit controlling the read-out operation. The control circuit 25 appropriately controls the operation for realizing a storage mode, designated by a control signal, of the memory cell 10 selected in the main memory region 1, based on written data, address signals designating the memory cells, and a control signal designating a storage mode (set state and reset state described later) of the memory cell 10 of the memory cell array 21, all of which being input to the input/output interface circuit 22.

Figure 4:
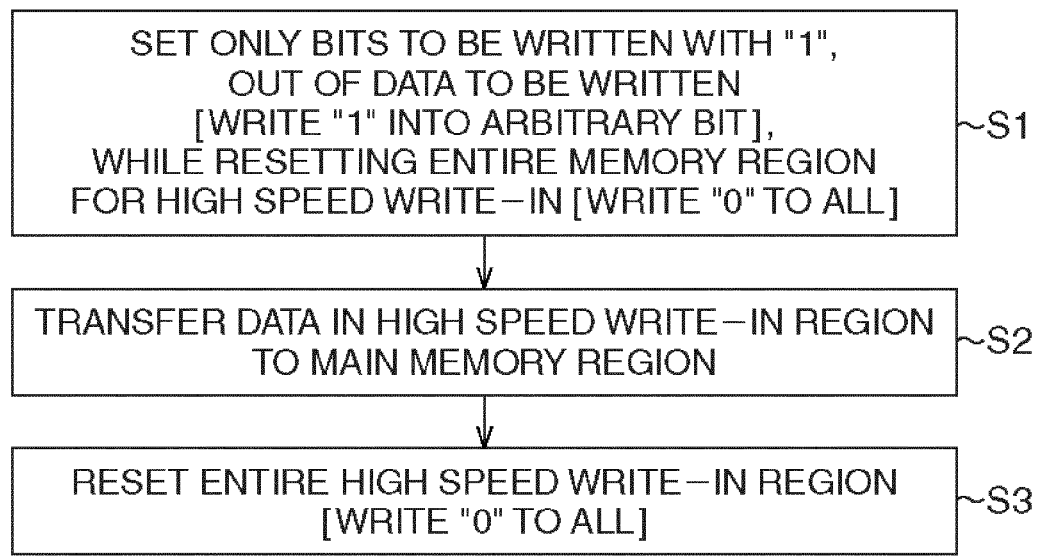
FIG. 4 is a flow chart illustrating procedures of a method of data write-in using the ReRAM according to the first embodiment.
Figure 5:
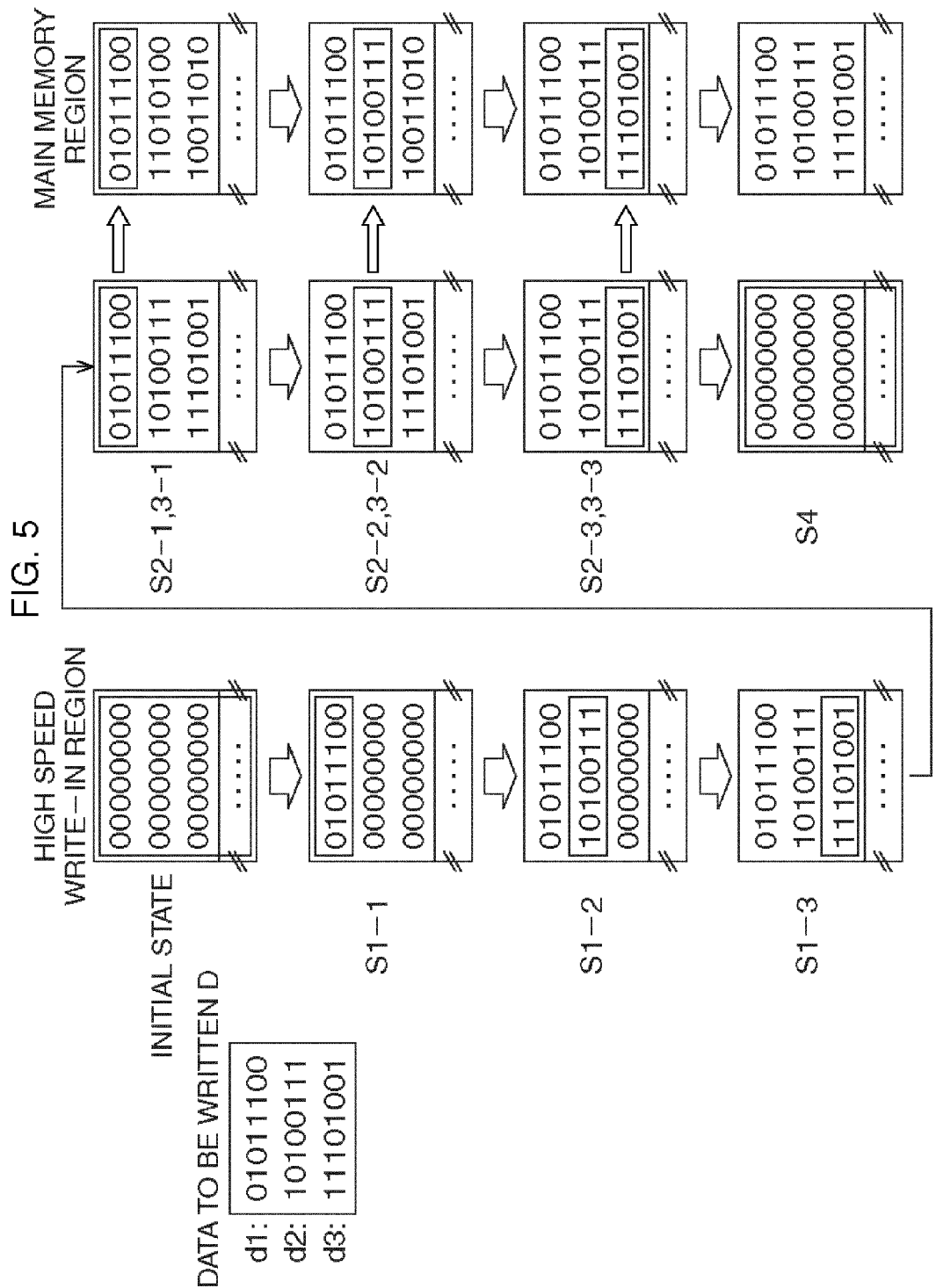
FIG. 5 is a schematic drawing illustrating changes in an 8-bit address space in a high speed write-in region according to the procedures of the method of data write-in, in the ReRAM of the first embodiment.
Figure 6:
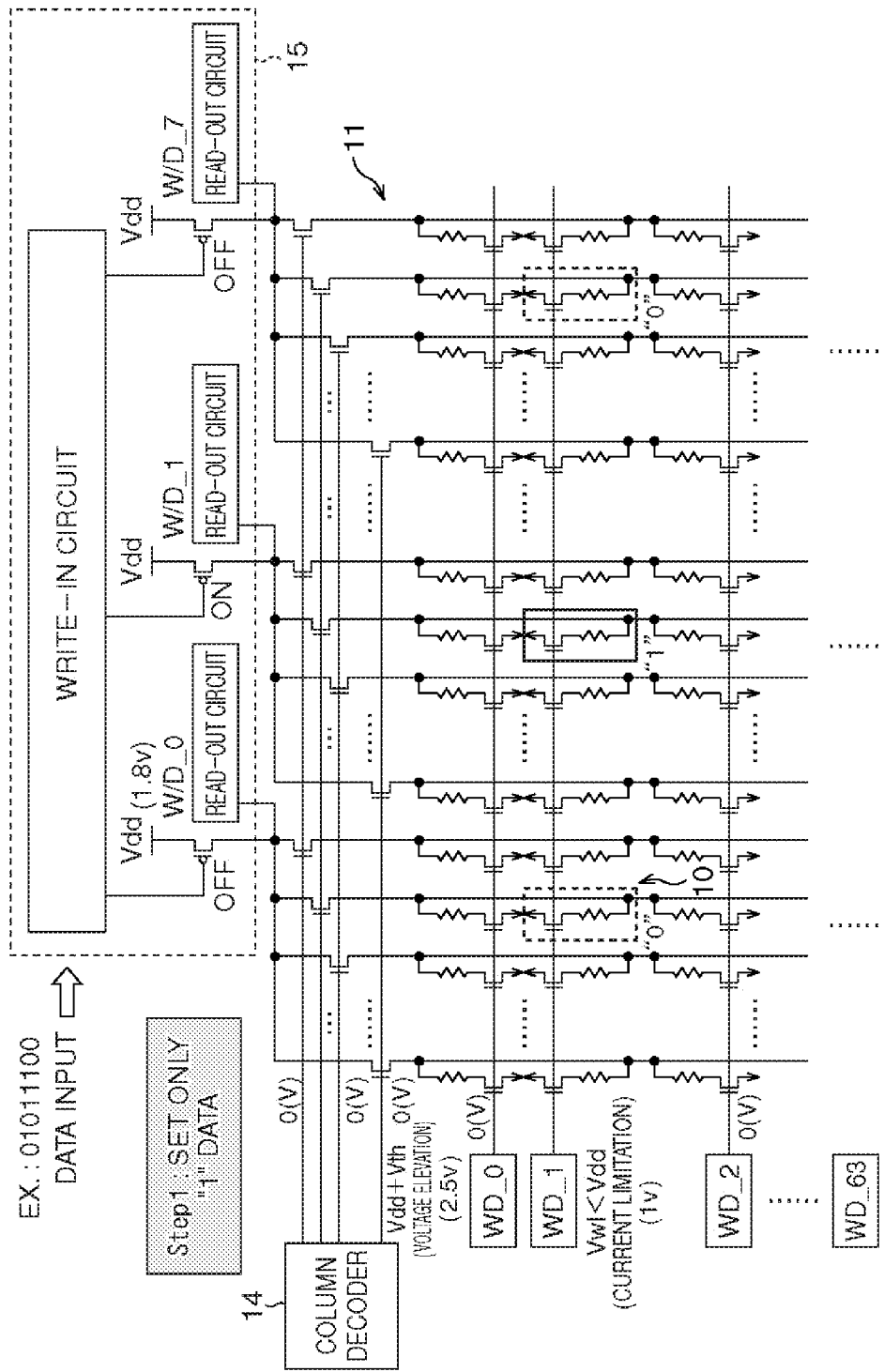
FIG. 6 is a wiring diagram explaining a setting operation in the memory cell array of the high speed write-in region, in the ReRAM of the first embodiment.
Figure 7:
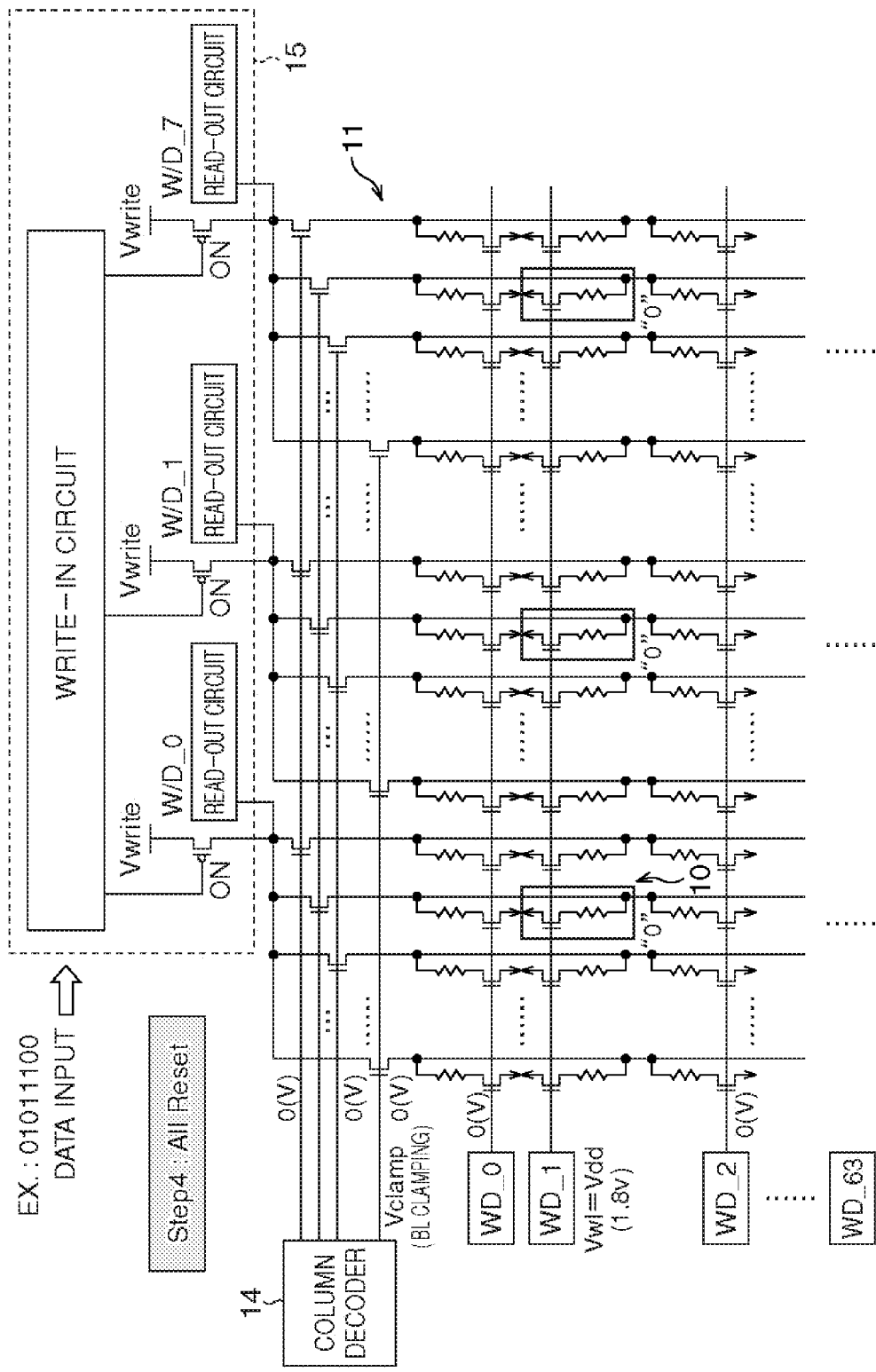
FIG. 7 is a wiring diagram explaining a resetting operation in the memory cell array of the high speed write-in region, in the ReRAM of the first embodiment.
Figure 8:
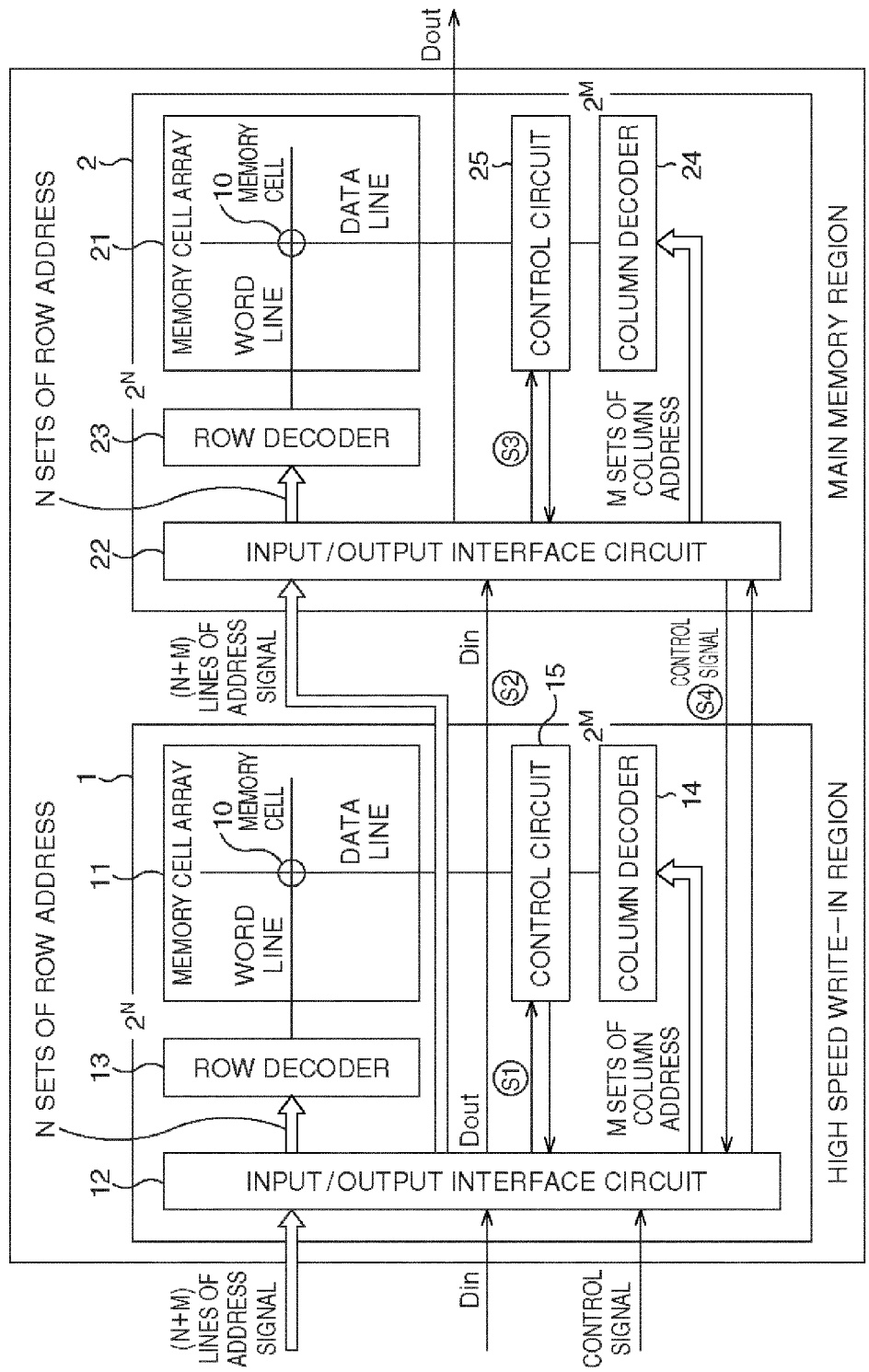
FIG. 8 is a block diagram illustrating input/output of the individual signals according to procedures of the method of data write-in, in the ReRAM of the first embodiment.

FIG. 4 is a flow chart illustrating procedures of a method of data write-in using the ReRAM according to this embodiment, FIG. 5 is a schematic drawing illustrating changes in an 8-bit address space in the high speed write-in region according to the procedures of the method of data write-in, in the ReRAM of this embodiment, FIG. 6 is a wiring diagram for explaining the setting operation in the memory cell array of the high speed write-in region, in the ReRAM of this embodiment, FIG. 7 is a wiring diagram for explaining a resetting operation in the memory cell array of the high speed write-in region, in the ReRAM of this embodiment, and FIG. 8 is a block diagram illustrating input/output of the individual signals according to procedures of the method of data write-in, in the ReRAM of this embodiment.

This embodiment will exemplify a case where a single data string to be stored in the high speed write-in region 1 in one cycle is composed of 8 bits, and where a data D to be written, which corresponds to a single write-in command, is composed of three data strings d1, d2 and d3, as illustrated in FIG. 5. The data D to be written herein is composed of 01011100 (d1), 10100111 (d2) and 11101001 (d3).

In the high speed write-in region 1, based on control by the control circuit 12, all memory cells 10 in the memory cell array 11 are preliminarily reset, or in the initial state. In other words, all memory cells 10 in the memory cell array 11 are reset to the no-storage state, or in the state of having "0" therein.

First, the high speed write-in region 1 sets only memory cells 10 designated to have the storage state, out of memory cells 10 corresponded to the data D to be written in the memory cell array 11, to the storage state. In other words, in this case, only the memory cells 10 designated to have the storage state are written with "1".

Step S1 is configured by three cycles (steps S1-1 to S1-3), as described below.

First, in step S1-1, the input/output interface circuit 12 inputs data string d1 out of the data D to be written, address signals designating only memory cells 10 corresponded to "1" in data string d1 (01011100), and a control signal placing a command of setting the designated memory cells 10. The address signals are input to the row decoder 13 and the column decoder 14, and data string d1 and the control signal are input to the control circuit 15, respectively. The setting operation is executed by the control circuit 15, only with respect to the memory cells 10 corresponded to "1" in data string d1 designated by the row decoder 13 and the column decoder 14, and "1" is written only in these memory cells 10.

The input/output interface circuit 12 has a function of temporarily latching (holding) the input data strings over the duration of one cycle only, wherein only a single data string (for example, data string 01011100 (8 bits)) may be latched. Accordingly, in order to accept the next data string, the data string temporarily latched in the input/output interface circuit 12 needs be written in the memory cell array 11.

Next, in step S1-2, the input/output interface circuit 12 inputs data string d2 out of the data D to be written, address signals designating only memory cells 10 corresponded to "1" in data string d2 (10100111), and a control signal placing a command of setting the designated memory cells 10. The address signals are input to the row decoder 13 and the column decoder 14, and data string d2 and the control signal are input to the control circuit 15, respectively. The setting operation is executed by the control circuit 15, only with respect to the memory cells 10 corresponded to "1" in data string d2 designated by the row decoder 13 and the column decoder 14, and "1" is written only in these memory cells 10.

Next, in step S1-3, the input/output interface circuit 12 inputs data string d3 out of the data D to be written, address signals designating only memory cells 10 corresponded to "1" in data string d3 (11101001), and a control signal placing a command of setting the designated memory cells 10. The address signals are input to the row decoder 13 and the column decoder 14, and data string d3 and the control signal are input to the control circuit 15, respectively. The setting operation is executed by the control circuit 15, only with respect to the memory cells 10 corresponded to "1" in data string d3 designated by the row decoder 13 and the column decoder 14, and "1" is written only in these memory cells 10.

The setting operation of the data D to be written may be completed as described in the above. A state of the memory cell array 11 in the process of setting operation is illustrated in FIG. 6.

Of W/D_0 to 7 connected to the control circuit 15, transistors on the lines through which "1" is written are turned ON. The word lines (WL) selected by the row decoder 13 based on the address signals are applied with voltage of $V_{WL}$<Vdd (1V, for example) so as to allow the cell transistors to be used as current-limiting elements. Non-selected word lines (WL) are set to 0(V). The data lines selected by the column decoder 14 based on the address signals are elevated in the potential (Vdd+$V_{th}$ (threshold voltage): 2.5 V, in the illustrated example) so as to sufficiently apply voltage to the memory cells 10. Since the control circuit 15 turns on only the lines through which "1" is written, so that only the memory cells 10 to be written with "1" will have "1" written therein.

As described in the above, in the setting operation with respect to the preliminarily reset memory cells, only the memory cells 10 corresponded to "1" in a data string are turned into the storage state in each cycle, so that the operation may rapidly be conducted.

Next, the high speed write-in region 1 reads out the data D to be written, already written in the predetermined memory cells 10 of the memory cell array 11, and then transfers them to the main memory region 2 (step S2). The main memory region 2 writes the data D to be written, transferred from the high speed write-in region 1, into the memory cell array 22. More specifically, the memory cells 10 of the memory cell array 22, corresponded to the transferred data D to be written, are reset to the no-storage state, and only the memory cells 10 designated to have the storage state out of the memory cells 10 are set to the storage state (step S3).

The data transfer operation described in the above is available anytime, so far as the ReRAM is not accessed from the control unit or the like. In practice, the data to be written is transferred, while setting a flag for control so as to limit access to the main memory region 2. The flag for control is aimed at indicating whether interruption is allowed or permitted.

Steps S2, S3 are respectively configured by three cycles (steps S2-1 to S2-3, and steps S3-1 to S3-3) as described below.

First, in step S2-1, the input/output interface circuit 12 transfers, to the input/output interface circuit 22 of the main memory region 2, data string d1 out of the data D to be written stored in the memory cell array 11, address signals designating the memory cells 10 corresponded to data string d1 in the memory cell array 21, and a control signal placing a command of resetting and setting the designated memory cells 10.

Next in step S3-1, corresponding to step S2-1, the address signals input to the input/output interface circuit 22 are input to the row decoder 23 and the column decoder 24, and data string d1 and the control signal are input to the control circuit 25, respectively. The memory cells 10 corresponded to data string d1 are selected by the row decoder 23 and column decoder 24, and the resetting operation of these memory cells 10 is executed by the control circuit 25, that is, "0" indicating the no-storage state is written. The setting operation is successively executed by the input/output control circuit 25, and thereby "1" is written only in the memory cells 10 corresponded to "1" in data string d1.

Since the memory cell array 21 holds the previously written data stored therein as described in the above, write-in of new data D to be written needs both of the resetting operation and the setting operation. The resetting operation however takes a longer time for switching, so that the high speed write-in is not available.

Next in step S2-2, the input/output interface circuit 12 transfers, to the input/output interface circuit 22 of the main memory region 2, data string d2 out of the data D to be written stored in the memory cell array 11, address signals designating the memory cells 10 corresponded to data string d2 in the memory cell array 21, and a control signal placing a command of resetting and setting the designated memory cells 10.

Next in step S3-2, corresponding to step S2-2, the address signals input to the input/output interface circuit 22 are input to the row decoder 23 and the column decoder 24, and data string d2 and the control signal are input to the control circuit 25, respectively. All memory cells 10 corresponded to data string d2 are selected by the row decoder 23 and column decoder 24, the resetting operation of these memory cells 10 is executed by the control circuit 25, that is, "0" indicating the no-storage state is written. The setting operation is successively executed by the input/output control circuit 25, and thereby "1" is written only in the memory cells 10 corresponded to "1" in data string d2.

Next, in step S2-3, the input/output interface circuit 12 transfers, to the input/output interface circuit 22 of the main memory region 2, data string d3 out of the data D to be written stored in the memory cell array 11, address signals designating the memory cells 10 corresponded to data string d3 in the memory cell array 21, and a control signal placing a command of resetting and setting the designated memory cells 10.

Next in step S3-3, corresponding to step S2-3, the address signals input to the input/output interface circuit 22 are input to the row decoder 23 and the column decoder 24, and data string d3 and the control signal are input to the control circuit 25, respectively. All memory cells 10 corresponded to data string d3 are selected by the row decoder 23 and column decoder 24, the resetting operation of these memory cells 10 is executed by the control circuit 25, that is, "0" indicating the no-storage state is written. The setting operation is successively executed by the input/output control circuit 25, and thereby "1" is written only in the memory cells 10 corresponded to "1" in data string d3.

In this way, the transfer operation of the data D to be written stored in the memory cell array 11, and the setting operation to the memory cell array 21 are completed.

Next, the control signal from the control circuit 25 is input through the input/output interface circuits 22, 12 to the control circuit 15, and the high speed write-in region 1 then resets all memory cells 10 of the memory cell array 11 based on control of the control circuit 15, that is, writes "0" to all memory cells 10 which indicates the initial state (step S4). In the process of resetting, all memory cells 10 are reset at a time. Alternatively, all memory cells 10 may appropriately be reset in a sequential manner.

A state of the memory cell array 11 in this process is illustrated in FIG. 7.

The control circuit 15 turns on all of W/D_0 to 7. The word lines (WL) selected by the row decoder 13 based on the address signals are applied with voltage $V_{WL}$=Vdd. The data lines selected by the column decoder 14 based on the address signal are set to the BL clamp voltage, so as to prevent themselves from being set again, after resetting of the memory cells 10.

As described in the above, in this embodiment, high speed data write-in is enabled, by preliminarily resetting all memory cells 10 of the memory cell array in the high speed write-in region 1, when data is written in the ReRAM.

As has been described in the above, according to the ReRAM of this embodiment, a high speed data write-in function and a data holding function in a non-volatile manner may be realized solely by the ReRAM, without being combined with any additional memory chip such as SRAM. The ReRAM of this embodiment may be adoptable to application in which high speed data write-in is conducted by a single write-in command, such as allowing a semiconductor memory to be quickly written with and then hold the final state of memory when the memory is powered off; and such as reducing the duration of time necessary for write-in of adjustment data, ID data and so forth when the semiconductor memories are shipped.

Second Embodiment

A second embodiment of the present invention will be explained below.

Figure 9:
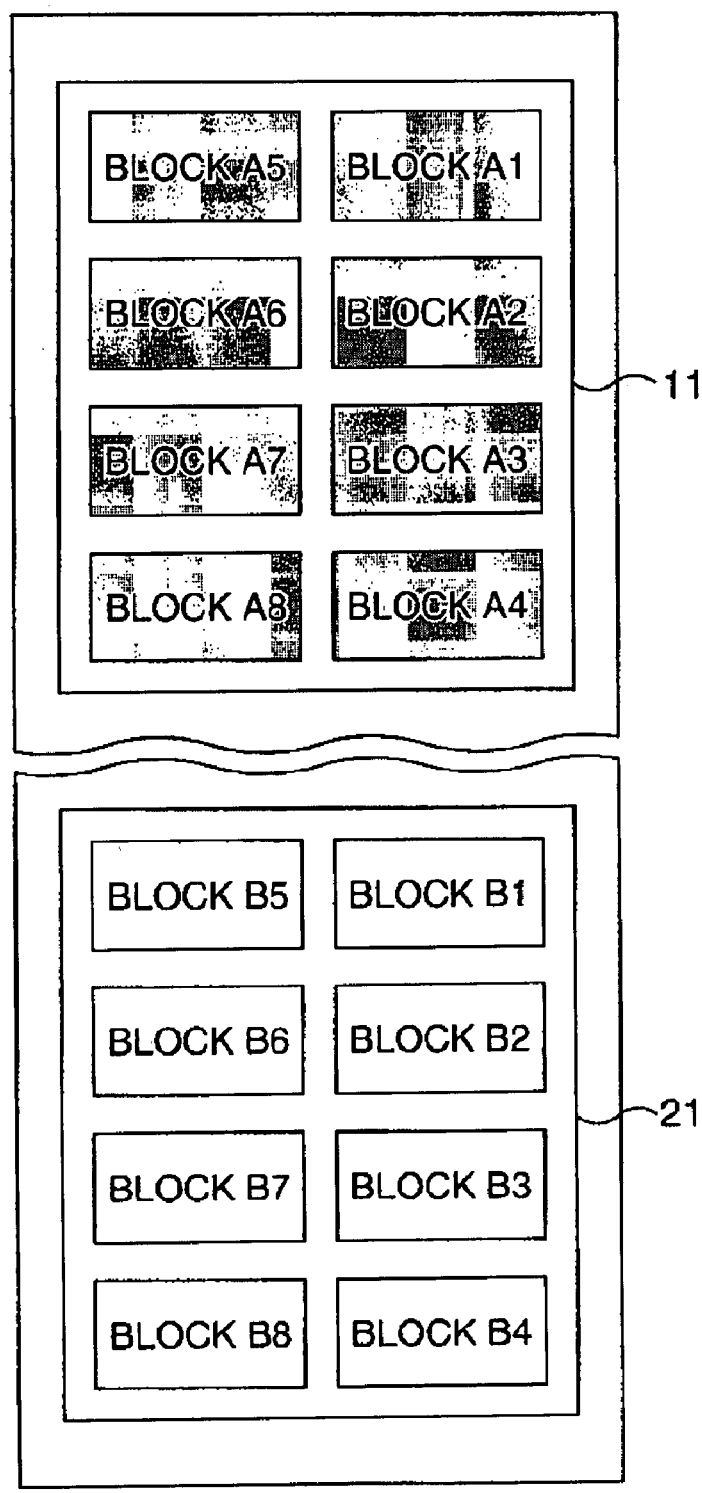
FIG. 9 is a schematic drawing illustrating only the individual memory cell arrays of an ReRAM according to a second embodiment.
Figure 10:
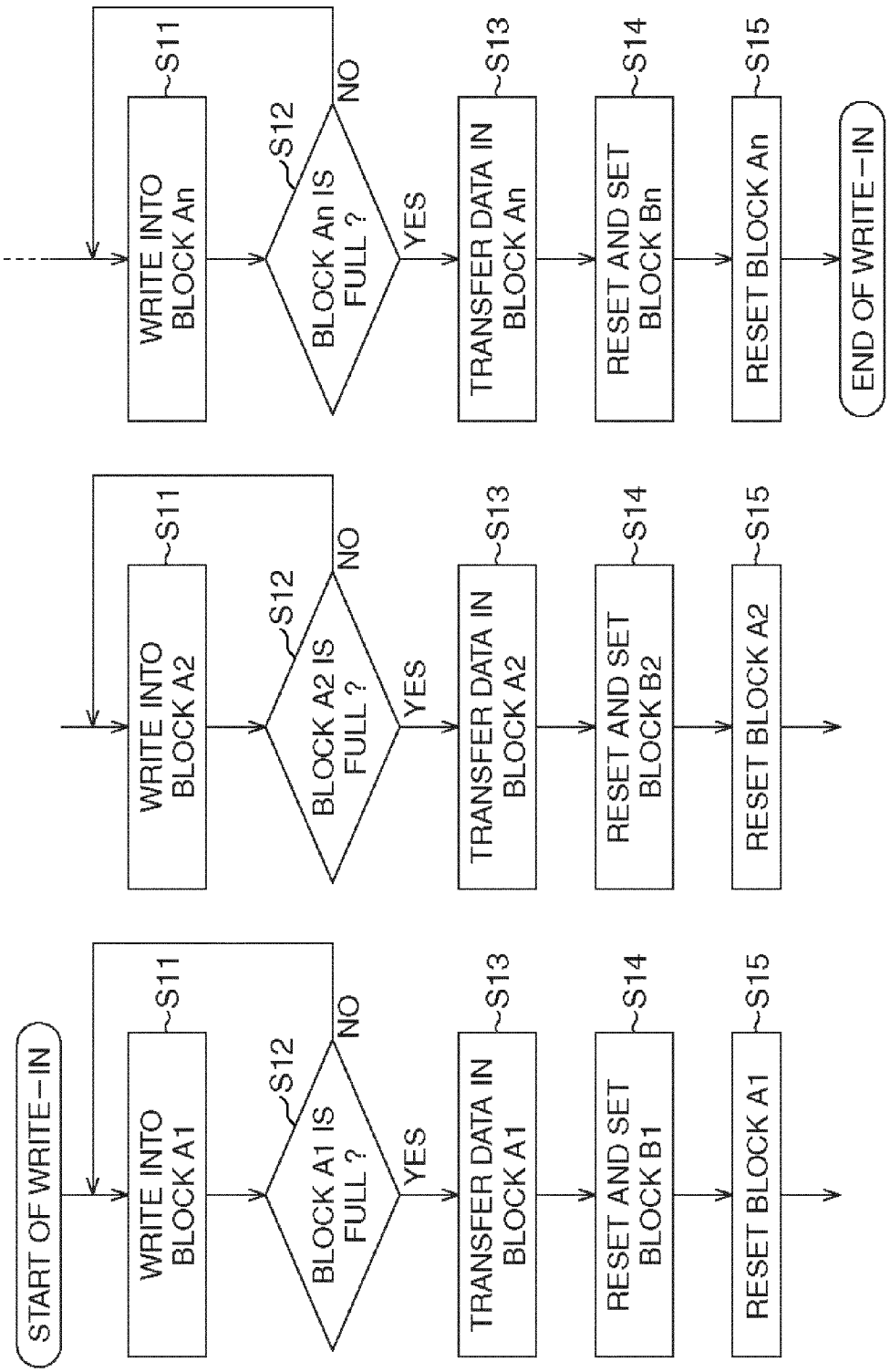
FIG. 10 is a flow chart illustrating procedures of a method of data write-in by the ReRAM of the second embodiment.

FIG. 9 is a schematic drawing illustrating only the individual memory cell arrays of an ReRAM according to this embodiment, and FIG. 10 is a flow chart illustrating procedures of a method of data write-in by the ReRAM of this embodiment.

The ReRAM of this embodiment is configured to have the high speed write-in region 1 and the main memory region 2, similarly to as described in the first embodiment, as illustrated in FIG. 1 and FIG. 2, but is different in the configuration of the memory cells 11, 12. Note that, for the convenience's sake of explanation, all constituents identical to those explained in the first embodiment will be given with the same reference numerals, and explanations therefor will not be repeated.

The memory cell array 11 in the high speed write-in region 1 is composed of a plurality of cell blocks, 8 cell blocks A1 to A8 in the illustrated example, each having a plurality of memory cells 10 arranged therein.

The memory cell array 21 in the main memory region 2 is composed of a plurality of cell blocks, 8 cell blocks B1 to B8 in the illustrated example, each having a plurality of memory cells 10 arranged therein.

Also in this embodiment, the memory cell arrays 11, 21 have the same storage capacity, with an 1:1 correspondence of addresses (have the same address space). In addition, Ak ($1 \leq k \leq 8$) in the cell blocks A1 to A8 and Bk ($1 \leq k \leq 8$) in the cell blocks B1 to B8 have the same storage capacity, with an 1:1 correspondence of addresses.

Similarly to as described in the first embodiment, in the high speed write-in region 1, the memory cells 10 of all cell blocks A1 to A8 in the memory cell array 11 are preliminarily reset as the initial state. In other words, all memory cells 10 in the memory cell array 11 are reset to the no-storage state, or initial state, and more specifically have "0" written therein.

First, based on control by the control circuit 12, the high speed write-in region 1 sets, with respect to cell block A1, only the memory cells 10 designated to have the storage state, out of the memory cells 10 corresponded to the data to be written in the memory cell array 11, to the storage state. More specifically, only the memory cells 10 designated to have the storage state are written with "1" (step S11).

Step S11 is executed until the storage capacity of cell block A1 is exceeded (step S12).

When the storage capacity of cell block A1 is exceeded, the set operation is temporarily interrupted, the high speed write-in region 1 reads out a part of data to be written already written in cell block A1 (corresponded to the storage capacity of a cell block 31) and then transfer it to the main memory region 2 (step S13).

If, in step S12, the data to be written does not exceed the storage capacity of cell block A1, all data to be written already written in cell block A1 in step S13 are transferred to the main memory region 2.

Next, based on control by the control circuit 25, the main memory region 2 writes a part of data to be written, transferred from the high speed write-in region 1, to cell block B1. More specifically, the memory cells 10 of cell block B1 corresponded to a part of transferred data to be written are reset to the no-storage state, and only the memory cells 10 designated to have the storage state out of the memory cells 10 are then set to the storage state (step S14).

In step S14, if the data to be written does not exceed the storage capacity of cell block A1, the main memory region 2 writes all data to be written, transferred from the high speed write-in region 1, to cell block B1.

Next, the control signal from the control circuit 25 is input through the input/output interface circuits 22, 12 to the control circuit 15, and the high speed write-in region 1 then resets all memory cells 10 of cell block A1 based on control of the control circuit 15 (step S15).

In this embodiment, steps S11 to S15 are executed until all data to be written are sequentially written in cell blocks A1 to An ($2 \leq n \leq 8$), all data to be written are transferred to the main memory region 2 and sequentially written in cell blocks B1 to Bn ($2 \leq n \leq 8$), and all cell blocks A1 to An are reset.

This embodiment not only expresses the various effects explained in the first embodiment, but is also suitable particularly for the case where the data to be written has a volume just as much as dividable to the cell blocks, and are used in a mode of random accessing to the ReRAM.

MODIFIED EXAMPLES

Now, various Modified Examples of the second embodiment will be explained. The ReRAM in each Modified Example is configured to have the high speed write-in region 1 and the main memory region 2 similarly to as described in the first embodiment as illustrated in FIG. 1 and FIG. 2; and the memory cell array 11 is composed of cell blocks A1 to A8, and the memory cell array 21 is composed of cell blocks B1 to B8 similarly to as described in the second embodiment, but is different in the mode of write-in.

Modified Example 1

Figure 11:
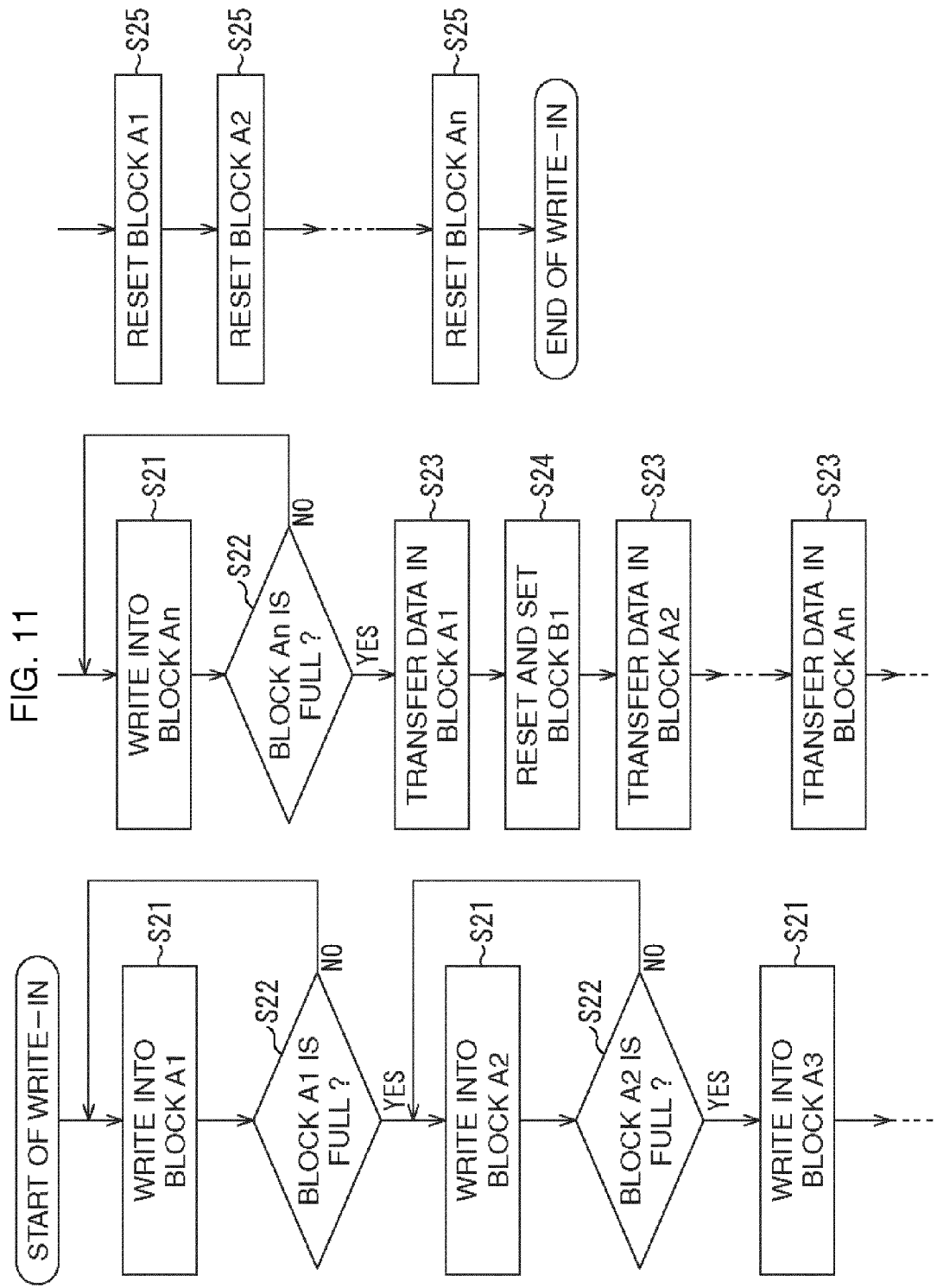
FIG. 11 is a flow chart illustrating procedures of a method of data write-in by the ReRAM of Modified Example 1 of the second embodiment.

FIG. 11 is a flow chart illustrating procedures of a method of data write-in by the ReRAM of Modified Example 1 of this embodiment.

Similarly to as described in the second embodiment, in the high speed write-in region 1, the memory cells 10 of all cell blocks A1 to A8 in the memory cell array 11 are preliminarily reset as the initial state. In other words, all memory cells 10 in the memory cell array 11 are reset to the no-storage state, or initial state, and more specifically have "0" written therein.

First, based on control by the control circuit 15, the high speed write-in region 1 sets, with respect to cell block A1, only the memory cells 10 designated to have the storage state, out of the memory cells 10 corresponded to the data to be written in the memory cell array 11, to the storage state. More specifically in this case, only the memory cells 10 designated to have the storage state are written with "1" (step S21).

Step S21 is executed until the storage capacity of cell block A1 is exceeded (step S22).

When the storage capacity of cell block A1 is exceeded, the setting operation in step S21 with respect to cell block A2 is executed until the storage capacity of cell block A2 is exceeded, similarly to as in step S22.

As described in the above, in this embodiment, steps S21, S22 are executed until all data to be written are sequentially written in cell blocks A1 to An ($2 \leq n \leq 8$).

When all data to be written are sequentially written in cell blocks A1 to An ($2 \leq n \leq 8$), the high speed write-in region 1 reads out the individual parts of the data to be written already written out from cell blocks A1 to An, and sequentially transfers them to the main memory region 2 on the basis of cell blocks A1 to An (step S23).

Succeeding to every step S23, the main memory region 2 sequentially ($k=1, 2 \ldots$) writes a part of the data to be written, transferred from cell block Ak ($1 \leq k \leq 8$) in the high speed write-in region 1 to cell block Bk (step S24: the resetting operation and the setting operation are executed similarly to as in step S14).

Next, a control signal from the control circuit 25 is input through the input/output interface circuits 22, 12 to the control circuit 15, and based on control by the control circuit 15, the high speed write-in region 1 sequentially ($k=1, 2 \ldots$) resets all memory cells 10 in cell block Ak ($1 \leq k \leq 8$) (step S25).

This embodiment not only expresses the various effects explained in the first embodiment, but is also suitable particularly for the case where the data to be written has a large volume to be processed by a single write-in command, which is as large as exceeding the storage capacity of the cell block, since the high speed write-in operation is executed over a plurality of cell blocks.

Modified Example 2

Figure 12:
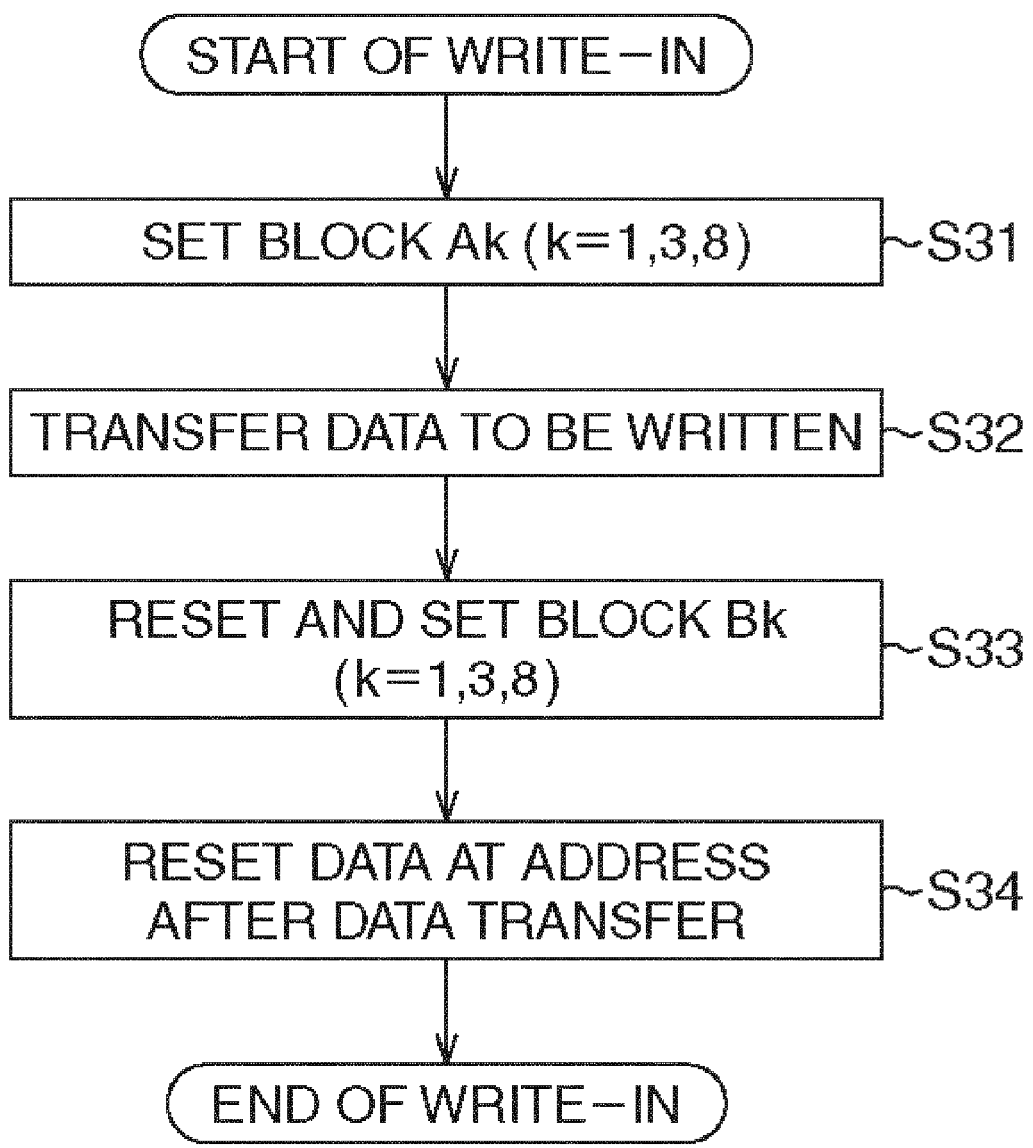
FIG. 12 is a flow chart illustrating procedures of a method of data write-in by the ReRAM of Modified Example 2 of the second embodiment.
Figure 13:
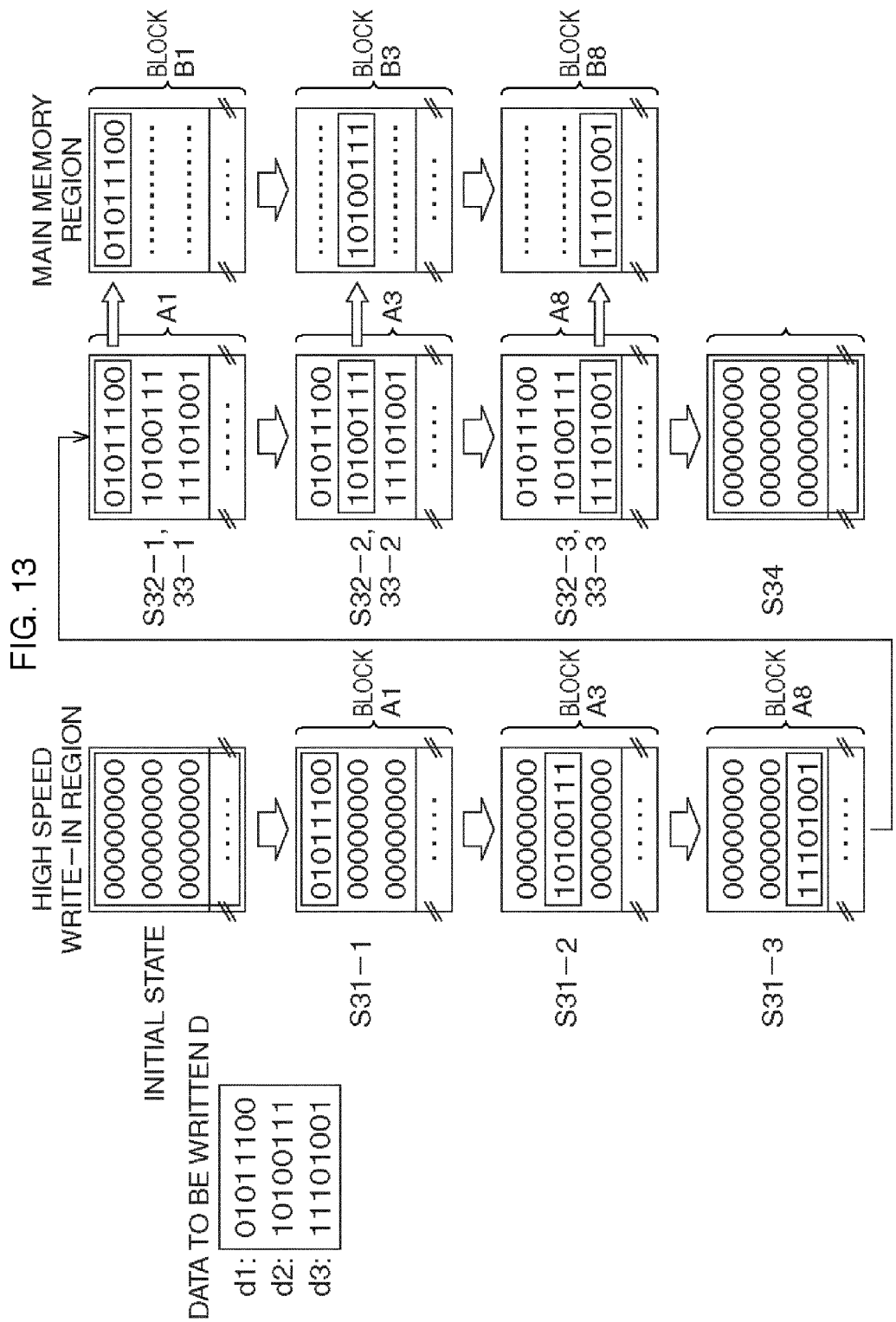
FIG. 13 is a schematic drawing illustrating changes in an 8-bit address space in a high speed write-in region according to the procedures of the method of data write-in, in the ReRAM of Modified Example 2 of the second embodiment.

FIG. 12 is a flow chart illustrating procedures of a method of data write-in by the ReRAM of Modified Example 2 of this embodiment, and FIG. 13 is a schematic drawing illustrating changes in an 8-bit address space in a high speed write-in region according to the procedures of the method of data write-in, in the ReRAM of Modified Example 2 of this embodiment.

In this example, the high speed write-in is controlled for every single write-in command. The high speed write-in region 1 is configured to transfer the data to the cell block having the same address in the main memory region 2, upon completion of the write-in operation by a single write-in command, irrespective of that the storage capacity of any arbitrary cell block written with the data string is exceeded or not.

For more detail, an exemplary case in which a single data string to be stored in one cycle to the high speed write-in region 1 is composed of 8 bits, and the data D to be written by a single write-in command is composed of three data strings d1, d2, d3 as illustrated in FIG. 13, will be shown. The data D to be written herein is composed of 01011100 (d1), 10100111 (d2), and 11101001 (d3).

Similarly to as described in the second embodiment, in the high speed write-in region 1, the memory cells 10 of all cell blocks A1 to A8 in the memory cell array 11 are preliminarily reset as the initial state. In other words, all memory cells 10 in the memory cell array 11 are reset to the no-storage state, or the initial state, and more specifically have "0" written therein.

First, based on control by the control circuit 15, the high speed write-in region 1 sequentially writes a part of the data to be written in an arbitrary cell block out of cell blocks A1 to A8, until the entire portion of the data to be written is written in the memory cell array 11 (step S31).

Step S31 is composed of three cycles (steps S31-1 to S31-3) as described below.

First, based on control by the control circuit 15, with respect to an arbitrary cell block, which is cell block A1 for example, the high speed write-in region 1 sets only the memory cells 10 designated to have the storage state, out of the memory cells 10 in the memory cell array 11 which are corresponded to a part of the data to be written, for example corresponded to a single data string d1 (01011100), to the storage state. More specifically, in this case, only the memory cells 10 designated to have the storage state are written with "1" (step S31-1).

Next, based on control by the control circuit 15, with respect to an arbitrary cell block, which is cell block A3 for example, the high speed write-in region 1 sets only the memory cells 10 designated to have the storage state, out of the memory cells 10 in the memory cell array 11 which are corresponded to a part of the data to be written, for example corresponded to a single data string d2 (10100111), to the storage state. More specifically, in this case, only the memory cells 10 designated to have the storage state are written with "1" (step S31-2).

Next, based on control by the control circuit 15, with respect to an arbitrary cell block, which is cell block A8 for example, the high speed write-in region 1 sets only the memory cells 10 designated to have the storage state, out of the memory cells 10 in the memory cell array 11 which are corresponded to a part of the data to be written, for example corresponded to a single data string d3 (11101001), to the storage state. More specifically, in this case, only the memory cells 10 designated to have the storage state are written with "1" (step S31-3).

Next, based on control by the control circuit 15, the high speed write-in region 1 reads the data D to be written already written in cell blocks A1, A3, A8 out therefrom, and transfers them to the main memory region 2 (step S32). The main memory region 2 then writes the data D to be written, transferred from the high speed write-in region 1, to cell blocks B1, B3, B8 corresponded to cell blocks A1, A3, A8. More specifically, the memory cells 10 in the memory cell array 22, which are corresponded to the transferred data D to be written, are reset to the no-storage state, and only the memory cells 10 designated to have the storage state out of the memory cells 10 are set to the storage state (step S33).

The steps S32, S33 are composed of three cycles (steps S32-1 to S32-3, and steps S33-1 to S33-3) as described below.

First, in step S32-1, the input/output interface circuit 12 inputs data string d1 out of the data D to be written stored in cell block A1, address signals designating the memory cells 10 corresponded to data string d1 in cell block B1, and a control signal placing a command of resetting and setting the designated memory cells 10, to the input/output interface circuit 22 of the main memory region 2.

Next, in step S33-1, corresponding to step S32-1, the address signals input to the input/output interface circuit 22 are input to the row decoder 23 and the column decoder 24, and data string d1 and the control signal are input to the control circuit 25, respectively. All memory cells 10 corresponded to data string d1 are selected by the row decoder 23 and the column decoder 24 in cell block B1, the resetting operation of these memory cells 10 is executed by the control circuit 25, and thereby "0" indicating the no-storage state is written. The setting operation is successively executed by the input/output control circuit 25, and thereby "1" is written only in the memory cells 10 corresponded to "1" in data string d1.

Next, in step S32-2, the input/output interface circuit 12 outputs data string d2 out of the data D to be written already stored in cell block A3, the address signals designating the memory cells 10 corresponded to data string d2 in cell block B3, and a control signal resetting and setting the designated memory cells 10, to the input/output interface circuit 22 of the main memory region 2.

Next, in step S33-2 corresponding to step S32-2, the address signals input to the input/output interface circuit 22 are input to the row decoder 23 and the column decoder 24, and data string d2 and the control signal are input to the control circuit 25, respectively. All memory cells 10 corresponded to data string d2 are selected by the row decoder 23 and the column decoder 24 in cell block B3, the resetting operation of these memory cells 10 is executed by the control circuit 25, and thereby "0" indicating the no-storage state is written. The setting operation is successively executed by the input/output control circuit 25, and thereby "1" is written only in the memory cells 10 corresponded to "1" in data string d2.

Next, in step S32-3, the input/output interface circuit 12 outputs data string d3 out of the data D to be written already stored in cell block A8, the address signals designating the memory cells 10 corresponded to data string d3 in cell block B3, and the control signal resetting and setting the designated memory cells 10, to the input/output interface circuit 22 of the main memory region 2.

Next, in step S33-3 corresponding to step S32-3, the address signals input to the input/output interface circuit 22 are input to the row decoder 23 and the column decoder 24, and data string d3 and the control signal are input to the control circuit 25, respectively. All memory cells 10 corresponded to data string d3 are selected by the row decoder 23 and the column decoder 24 in cell block B8, the resetting operation of these memory cells 10 is executed by the control circuit 25, and thereby "0" indicating the no-storage state is written. The setting operation is successively executed by the input/output control circuit 25, and thereby "1" is written only in the memory cells 10 corresponded to "1" in data string d3.

Next, the control signal from the control circuit 25 is input through the input/output interface circuits 22, 12 to the control circuit 15, the high speed write-in region 1 then resets all memory cells 10 of cell blocks A1, A3, A8 based on control by the control circuit 15, that is, writes "0" to all memory cells 10, which indicates the initial state (step S34). The resetting operation is executed on the data basis for every single write-in command.

This embodiment not only expresses the various effects explained in the first embodiment, but is also suitable particularly for the case where addresses of a plurality of cell blocks are randomly accessed.

Third Embodiment

A third embodiment of the present invention will be explained.

Figure 14:
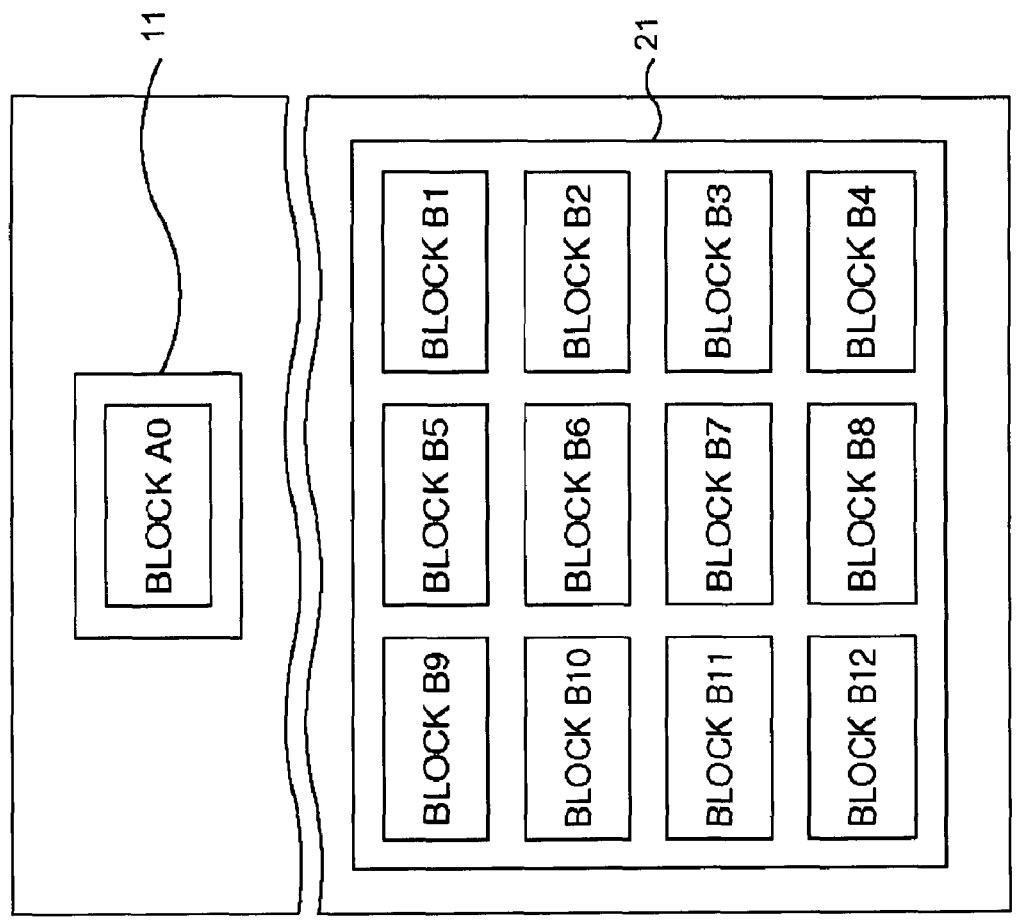
FIG. 14 is a schematic drawing illustrating only the individual memory cell arrays of an ReRAM according to a third embodiment.
Figure 15:
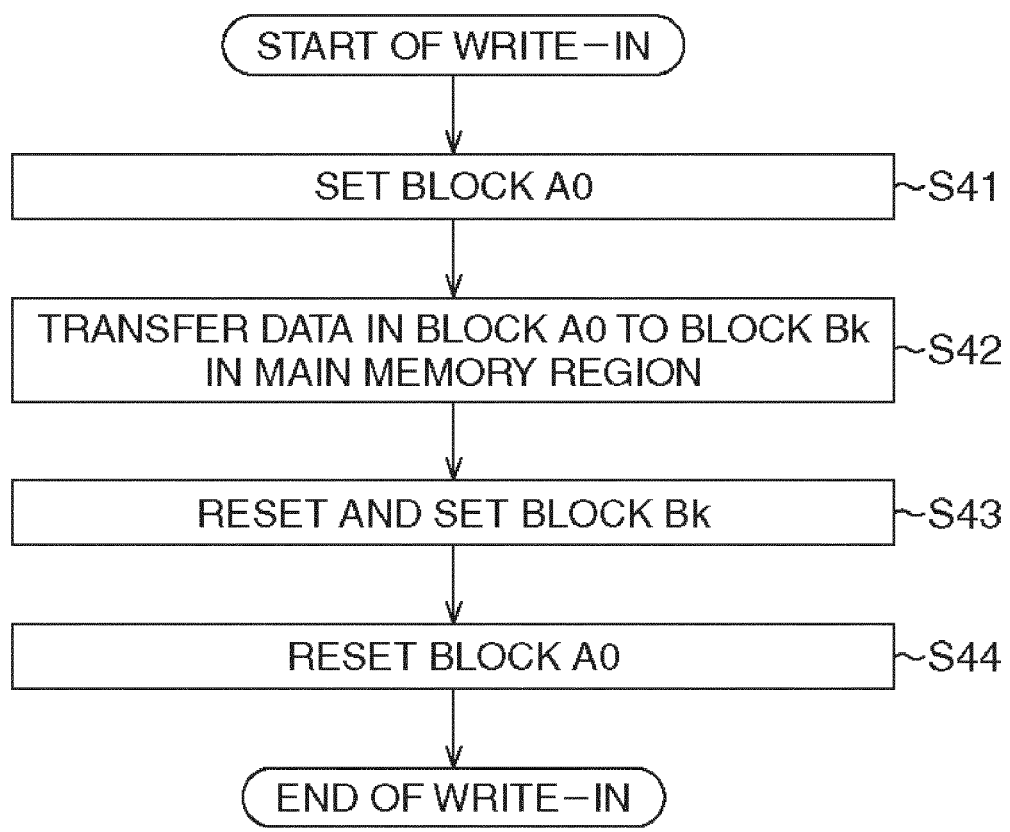
FIG. 15 is a flow chart illustrating procedures of a method of data write-in by the ReRAM of the third embodiment.

FIG. 14 is a schematic drawing illustrating only the individual memory cell arrays of an ReRAM according to this embodiment, and FIG. 15 is a flow chart illustrating procedures of a method of data write-in by the ReRAM of this embodiment.

The ReRAM of this embodiment is configured to have the high speed write-in region 1 and the main memory region 2, similarly to as described in the first, as illustrated in FIG. 1 and FIG. 2, but is different in the configuration of the memory cells 11, 12. Note that, for the convenience's sake of explanation, all constituents identical to those explained in the first and second embodiments will be given with the same reference numerals, and explanations therefor will not be repeated.

The memory cell array 11 of the high speed write-in region 1 is configured as a single cell block A0 having a plurality of memory cells 10 arranged therein.

In contrast, the memory cell array 21 of the main memory region 2 is configured to have a plurality of cell blocks, 12 cell blocks B1 to B12 in the illustrated example, each having a plurality of memory cells 10 arranged therein.

In this embodiment, unlike the second embodiment, the storage capacity of the memory cell array 21 of the main memory region 2 is relatively larger than the storage capacity of the memory cell array 11 of the high speed write-in region 1. More specifically, the cell block A0 typically has the same storage capacity with cell blocks B1 to B12. The cell block A0 therefore does not correspond with the cell blocks B1 to B12 in an 1:1 manner, but the high speed write-in region 1 has a function of a sort of light buffer, which allows therein desired write-in to addresses of the main memory region 2 by address conversion.

Similarly to as described in the first embodiment, in the high speed write-in region 1, the memory cells 10 of cell block A0 are preliminarily reset as the initial state. In other words, all memory cells 10 in cell block A0 are reset to the no-storage state, or initial state, and more specifically have "0" written therein.

First, based on control by the control circuit 15, the high speed write-in region 1 sets only the memory cells 10 designated to have the storage state out of the memory cells 10 in cell block A0, which are corresponded to the data to be written, to the storage state. More specifically, in this case, only the memory cells 10 designated to have the storage state are written with "1" (step S41).

Next, based on control by the control circuit 15, the high speed write-in region 1 reads the data to be written already written in cell block A0, and transfers them to the main memory region 2 (step S42).

Next, based on control by the control circuit 25, the main memory region 2 writes a part of the data to be written, transferred from the high speed write-in region 1, to any one (Bk) of cell blocks B1 to B12. More specifically, the memory cells 10 of the cell block Bk corresponded to a part of the transmitted data to be written are reset to the no-storage state, and only the memory cells 10 designated to have the storage state out of the memory cells 10 are set to the storage state (step S43).

Next, a control signal from the control circuit 25 is input through the input/output interface circuits 22, 12 to the control circuit 15, and the high speed write-in region 1 resets all memory cells 10 of cell block A0 based on control by the control circuit 15 (step S44).

This embodiment not only expresses the various effects explained in the first embodiment, but is also suitable particularly for the case where the data volume to be written at one time does not exceed the capacity of cell block A0, and the write-in operation does not occur in succession. For the case where the data volume to be written at one time exceeds the capacity of cell block, or for the case where the next write-in operation occurs in the process of data transfer immediately after the previous write-in, in the process of data transfer to the main memory region 2, the write-in operation needs be interrupted, and then re-started after completion of the data transfer and resetting. This embodiment is advantageous in that the capacity of the memory cell array 21 of the main memory region 2 may be set relatively larger than those in the second embodiment and the relevant Modified Examples.

Fourth Embodiment

Figure 16:
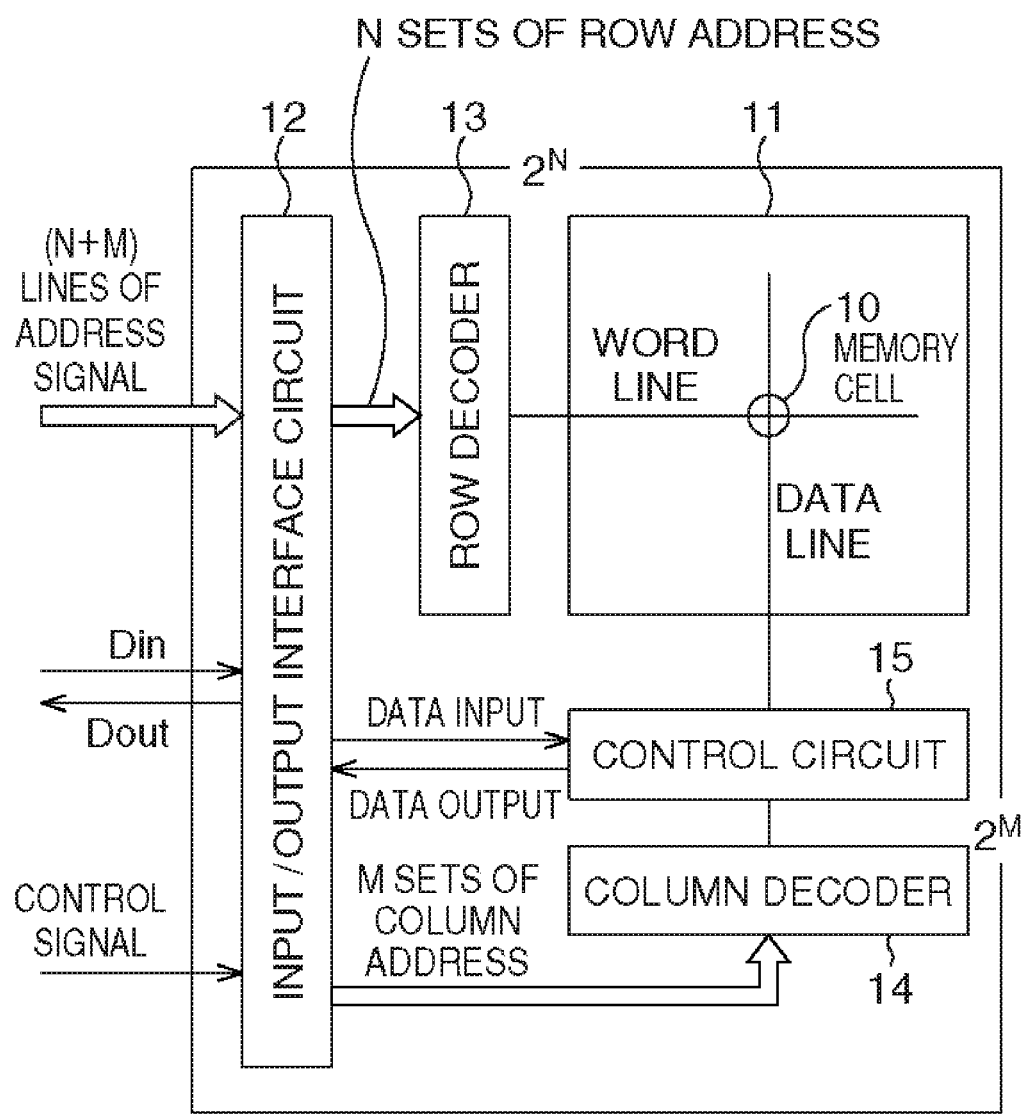
FIG. 16 is a block diagram schematically illustrating an overall configuration of an ReRAM according to a fourth embodiment.
Figure 17:
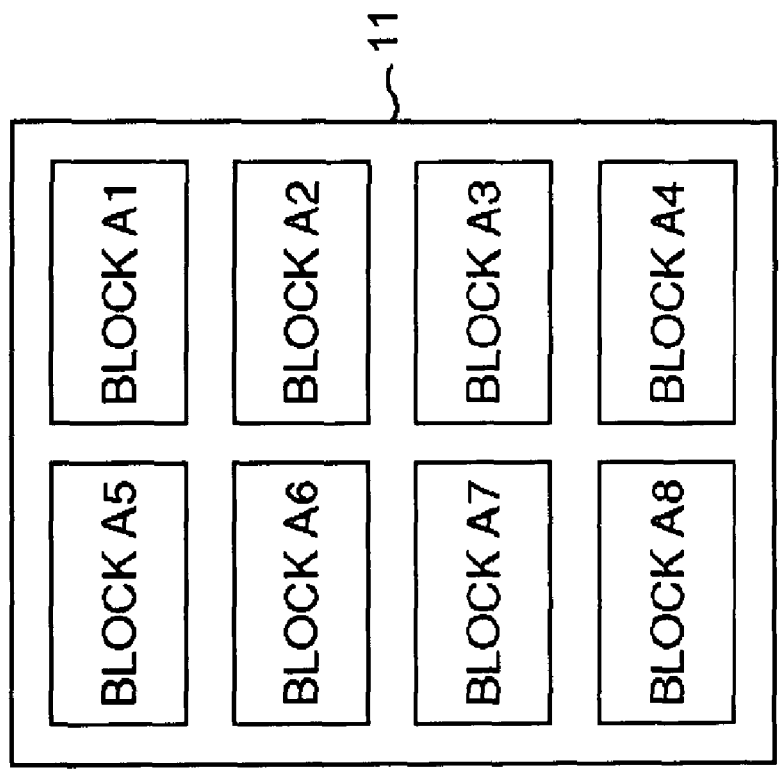
FIG. 17 is a block diagram specifically illustrating the individual memory regions of the ReRAM according to the fourth embodiment.
Figure 18:
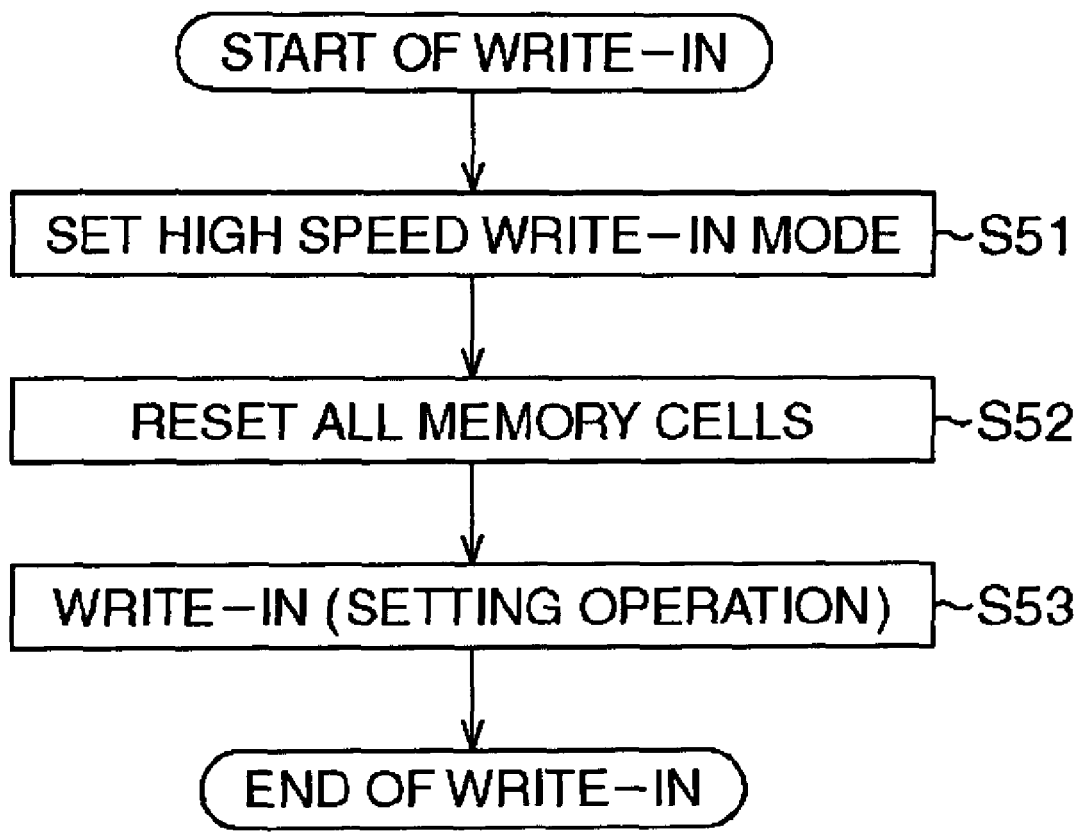
FIG. 18 is a flow chart illustrating procedures of a method of data write-in by the ReRAM of the fourth embodiment.

FIG. 16 is a block diagram schematically illustrating an overall configuration of an ReRAM according to this embodiment, FIG. 17 is a block diagram specifically illustrating the individual memory regions of the ReRAM according to this embodiment, and FIG. 18 is a flow chart illustrating procedures of a method of data write-in by the ReRAM of this embodiment.

The ReRAM of this embodiment is configured to have only high speed write-in region 1, mainly aimed at performing high speed write-in explained in the second embodiment. Similarly to as described in the second embodiment, the memory cell array 11 is composed of a plurality of cell blocks, 8 cell blocks A1 to A8 in the illustrated example, each having a plurality of memory cells 10 arranged therein.

The ReRAM of this embodiment may be made selectable or settable between the normal use mode and the high speed write-in mode. When the normal use mode is set in this case, the general data write-in and read-out operations are executed similarly to those in the main memory region 2. On the other hand, when the high speed write-in mode is set, the high speed write-in operation as the high speed write-in region 1 as described in the above is executed. In the method of write-in explained below, an exemplary case where such selection-and-setting function is owned by a memory controller, and the high speed write-in mode is selected and set.

First, based on the selection and setting by the memory controller, the ReRAM is set to the high speed write-in mode (step S51).

Next, based on control by the control circuit 15, the high speed write-in region 1 resets all memory cells 10 of cell blocks A1 to A8 in the memory cell array 11, as the initial state (step S52). In other words, all memory cells 10 in the memory cell array 11 are reset to the no-storage state, or the initial state, and more specifically have "0" written therein.

Next, based on control by the control circuit 15, the high speed write-in region 1 sets, with respect to cell block A1, only the memory cells 10 designated to have the storage state out of the memory cells 10 corresponded to the data to be written in the memory cell array 11, to the storage state. In other words, in this case, only the memory cells 10 designated to have the storage state are written with "1" (step S53).

Step S53 is executed until the storage capacity of cell block A1 is exceeded. When the storage capacity of cell block A1 is exceeded, the process advances to cell block A2, where step S53 is similarly executed until the storage capacity of cell block A2 is exceeded. Step S53 is similarly executed thereafter, until all data to be written is sequentially written in cell blocks A3 to An ($4 \leq n \leq 8$).

Although the high speed write-in is available only once in this method of write-in, there are a lot of demands on high speed write-in even if it is available only once. The ReRAM is suitable for applications such as allowing a semiconductor memory to be quickly written with and then held the final state of memory when the memory is powered off; and such as reducing the duration of time necessary for write-in of adjustment data, ID data and so forth when the semiconductor memories are shipped. It is also suitable typically for a resume function of personal computers.

Fifth Embodiment

Figure 19:
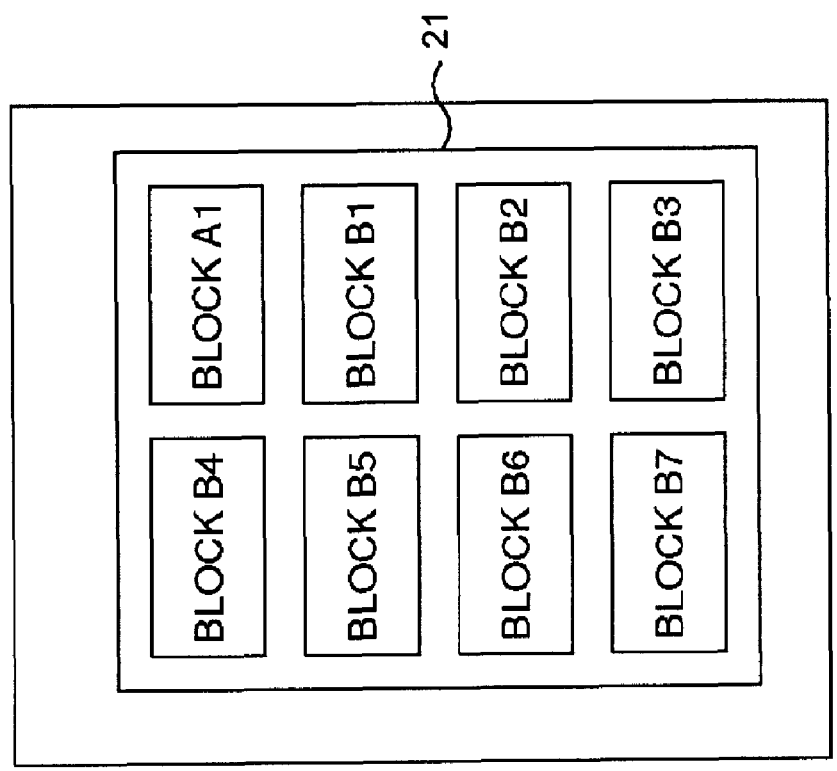
FIG. 19 is a block diagram schematically illustrating an overall configuration of an ReRAM according to a fifth embodiment.
Figure 20:
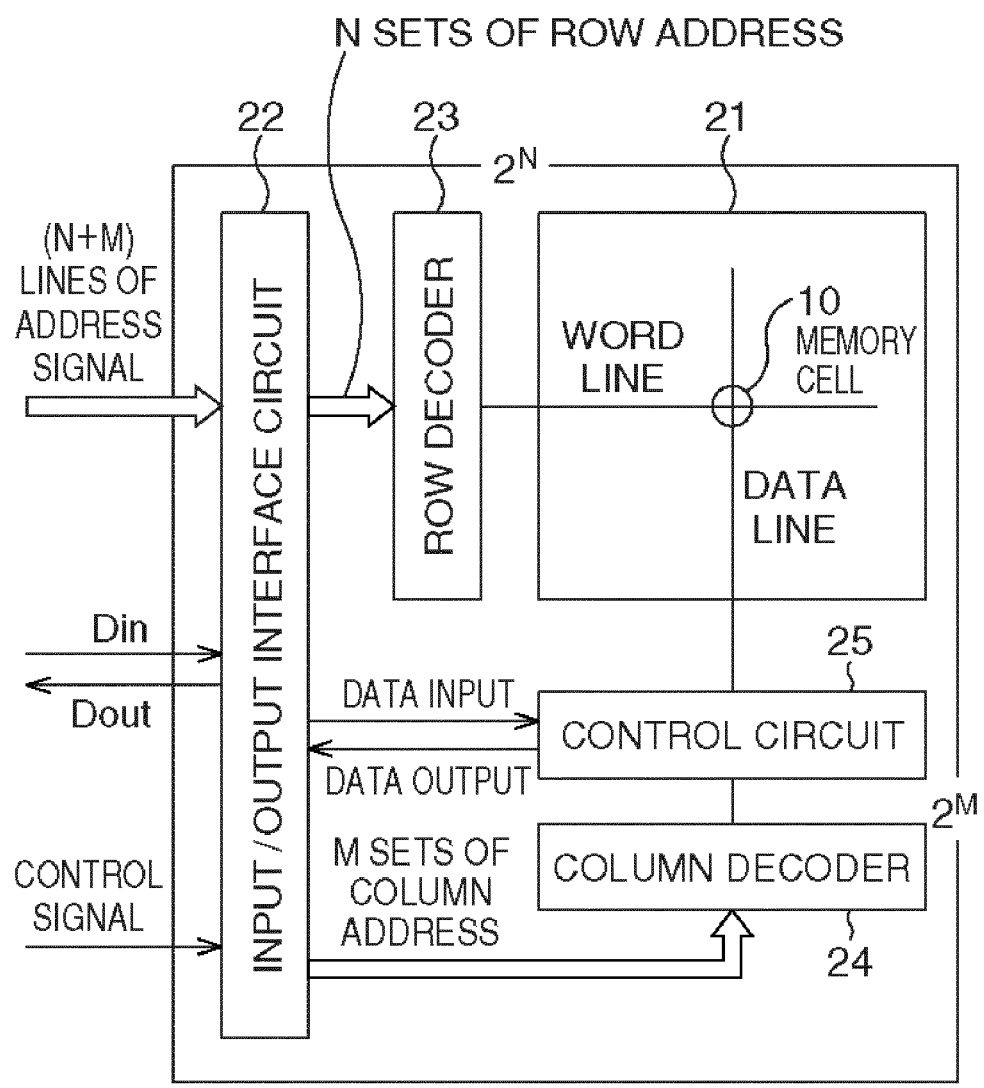
FIG. 20 is a block diagram specifically illustrating the individual memory regions of the ReRAM according to the fifth embodiment.
Figure 21:
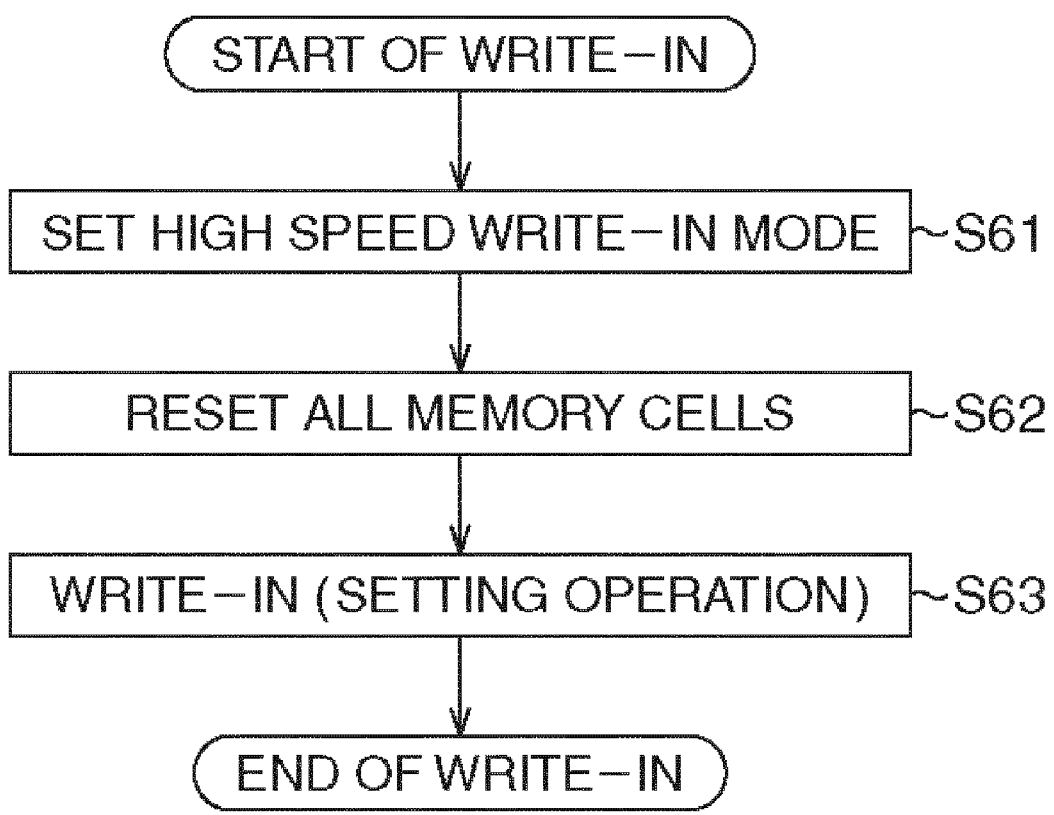
FIG. 21 is a flow chart illustrating procedures of a method of data write-in by the ReRAM of the fifth embodiment.

FIG. 19 is a block diagram schematically illustrating an overall configuration of an ReRAM according to this embodiment, FIG. 20 is a block diagram specifically illustrating the individual memory regions of the ReRAM according to this embodiment, and FIG. 21 is a flow chart illustrating procedures of a method of data write-in by the ReRAM of this embodiment.

The ReRAM of this embodiment is configured to have only the main memory region 2, mainly aimed at performing general data write-in and read-out, as explained in the second embodiment. An aspect different from the second embodiment is that the memory cell array 11 in the main memory region 2 is composed of cell blocks used for high speed write-in application, which include cell block A1, and the cell blocks allowed for general data write-in and read-out, such as cell blocks B1 to B7 for example.

The ReRAM of this embodiment is made freely selectable or settable between the normal use mode and the high speed write-in mode, by a memory controller. When the normal use mode is set in this case, the general data write-in and read-out operations are executed similarly to those in the main memory region 2, with respect to block cells B1 to B7. On the other hand, when the high speed write-in mode is set, the high speed write-in operation as the high speed write-in region 1 as described in the above is executed with respect to block cell A1. In the method of write-in explained below, an exemplary case where such selection-and-setting function is owned by a control unit, and the high speed write-in mode is selected and set.

First, based on the selection and setting by the memory controller, the ReRAM is set to the high speed write-in mode (step S61).

Next, based on control by the control circuit 25, the main memory region 2 resets all memory cells 10 of cell block A1 in the memory cell array 21, as the initial state (step S62). In other words, all memory cells 10 in the memory cell array 21 are reset to the no-storage state, or initial state, and more specifically have "0" written therein.

Next, based on control by the control circuit 25, the high speed write-in region 1 sets, with respect to cell block A1, only the memory cells 10 designated to have the storage state out of the memory cells 10 corresponded to the data to be written in the memory cell array 11, to the storage state. In other words, in this case, only the memory cells 10 designated to have the storage state are written with "1" (step S63).

In this embodiment, the data to be written are not transferred from cell blocks A1 to cell blocks B1 to B7.

This embodiment not only expresses the various effects explained in the first embodiment, but is also suitable particularly for the case where the ReRAM is used almost for the purpose of read-only, almost without re-writing data once they are written, by providing cell block A1 for high speed write-in to a part of the memory cell array 21.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A resistive memory which stores data making use of changes in resistance induced by applied voltage, comprising:
   a first memory region having a first memory cell array having a plurality of resistive elements arranged therein; and
   a second memory region having a second memory cell array having a plurality of resistive elements arranged therein,
   wherein in the process of data write-in,
   the first memory region is set to the initial state in which all resistive elements in the first memory cell array reset to a high resistance state, and sequentially executes therein a first operation setting only designated resistive elements out of the resistive elements corresponded to the data to a low resistance state; a second operation transferring the data written in the first memory cell array to the second memory region; and a third operation resetting all resistive elements to the high resistance state after the data transfer operation, so as to attain the initial state, and
   the second memory region executes therein a fourth operation resetting the resistive elements in the second memory cell array corresponded to the data transferred from the first memory region to the high resistance state, and then setting only designated resistive elements out of the resistive elements to the low resistance state.

2. The resistive memory according to claim 1, wherein the first memory region resets all resistive elements at a time, when the third operation is executed.

3. The resistive memory according to claim 1, wherein
   the first memory cell array comprises a plurality of first element blocks each having the plurality of resistive elements arranged therein, and
   the second memory cell array comprises a plurality of second element blocks each having the plurality of resistive elements arranged therein.

4. The resistive memory according to claim 3, wherein in the process of data write-in,
   the first memory region sequentially executes therein, with respect to a predetermined first element block, a series of operations which comprises the first operation, the second operation which starts when a predetermined value of storage capacity of the first element block is reached, and the third operation, on the basis of every first element block until all data are written in the first memory cell array, and the second memory region sequentially executes the fourth operation on the basis of every second element block corresponded to the second operation on the basis of every first element block.

5. The resistive memory according to claim 3,
wherein in the process of data write-in,
the first memory region
sequentially executes the first operation for a predetermined first element block, and the first operation for the next first element block advanced from the previous one when a predetermined value of storage capacity of the predetermined first element block was reached, until all data are written in the first memory cell array, and
executes the second operation on the basis of every first element block, and the third operation for all of the first element blocks, after all data were written in the first memory cell array, and
the second memory region sequentially executes the fourth operation on the basis of every second element block corresponded to the second operation on the basis of every first element block.

6. The resistive memory according to claim 3,
wherein in the process of data write-in,
the first memory region
executes the first operation with respect to an arbitrary first element block, on the basis of every data string which is a part of the data corresponded to a single write-in command, until all data are written in the first memory cell array, and
executes the second operation on the basis of every data string, and the third operation for all data strings, after all data were written in the first memory cell array, and
the second memory region sequentially executes the fourth operation corresponded to the second operation on the basis of every data string.

7. The resistive memory according to claim 1, wherein the second memory cell array has a storage capacity larger than that of the first memory cell array.

8. A resistive memory which stores data making use of changes in resistance induced by applied voltage, comprising a memory cell array having a plurality of resistive elements arranged therein,
configured to execute, in the process of data write-in, a resetting operation resetting all resistive elements in the memory cell array to a high resistance state, or the initial state; and a setting operation setting only designated resistive elements out of the resistive elements corresponded to the data to a low resistance state.

9. A resistive memory which stores data making use of changes in resistance induced by applied voltage, comprising a memory cell array having a plurality of resistive elements arranged therein,
the memory cell array comprising a plurality of first element blocks each having the plurality of resistive elements arranged therein, and a plurality of second element blocks each having a plurality of resistive elements arranged therein,
wherein in the process of data write-in,
the first element blocks are set to the initial state in which all resistive elements in the first memory cell array reset to a high resistance state, and sequentially executes therein a setting operation setting only designated resistive elements out of the resistive elements corresponded to the data to a low resistance state; and a resetting operation resetting all resistive elements to the high resistance state, or the initial state.

10. A method of data write-in into a resistive memory which stores data making use of changes in resistance induced by applied voltage, and comprises a first memory region having a first memory cell allay having a plurality of resistive elements arranged therein, and a second memory region having a second memory cell array having a plurality of resistive elements arranged therein,
wherein in the process of data write-in,
in the first memory region, all resistive elements of the first memory cell array are reset to a high resistance state, or the initial state, and
the method is configured to execute:
a first step setting, in the first memory region, only designated resistive elements out of the resistive elements corresponded to the data to a low resistance state;
a second step transferring, in the first memory region, the data written in the first memory cell array to the second memory region;
a third step resetting, in the second memory region, the resistive elements of the second memory cell array corresponded to the data transferred from the first memory region to the high resistance state, and then setting only designated resistive elements out of the resistive elements to the low resistance state; and
a fourth step resetting, in the first memory region, all resistive elements to the high resistance state, or the initial state.

11. The method of data write-in into a resistive memory according to claim 10,
wherein, in the fourth step, all resistive elements are reset at a time.

12. The method of data write-in into a resistive memory according to claim 11, having the first memory cell array configured by a plurality of first element blocks each having the plurality of resistive elements arranged therein, and the second memory cell array configured by a plurality of second element blocks each having the plurality of resistive elements arranged therein,
wherein in the process of data write-in,
a series of operations which comprises the first step in the first element block; the second step which starts when a predetermined value of storage capacity of the first element block is reached; the third step in the second element block corresponded to the first element block; and the fourth step in the predetermined first element block, are sequentially executed with respect to all data.

13. The method of data write-in into a resistive memory according to claim 11, having the first memory cell array configured by a plurality of first element blocks each having the plurality of resistive elements arranged therein, and the second memory cell array configured by a plurality of second element blocks each having the plurality of resistive elements arranged therein,
wherein in the process of data write-in,
the first step for a predetermined first element block, and the first step for the next first element block advanced from the previous one when a predetermined value of storage capacity of the first element block was reached, are sequentially executed until all data are written in the first memory cell array, and
after all data were written in the first memory cell array, the second step on the basis of every first element block, the third step on the basis of every second element block corresponded to the first element block, and the fourth step for all first element blocks are executed.

14. The method of data write-in into a resistive memory according to claim 11, having the first memory cell array configured by a plurality of first element blocks each having the plurality of resistive elements arranged therein, and the second memory cell array configured by a plurality of second element blocks each having the plurality of resistive elements arranged therein, wherein in the process of data write-in, the first step is executed with respect to an arbitrary first element block, on the basis of every data string which is a part of the data corresponded to a single write-in command, until all data are written in the first memory cell array, and after all data were written in the first memory cell array, the second step on the basis of every data string, the third step corresponded to the second step on the basis of every data string, and the fourth step for all data string are executed.

15. A method of data write-in into a resistive memory which stores data making use of changes in resistance induced by applied voltage, and comprises a memory cell array having a plurality of resistive elements arranged therein, wherein in the process of data write-in, the method is configured to execute a first step resetting all resistive elements of the memory cell array to a high resistance state, or the initial state; and a second step setting only designated resistive elements out of the resistive elements corresponded to the data to a low resistance state.

16. A method of data write-in into a resistive memory which stores data making use of changes in resistance induced by applied voltage, and comprises a memory cell array having a plurality of first element blocks each having a plurality of the resistive elements arranged therein, and a plurality of second element blocks each having a plurality of the resistive elements arranged therein, wherein in the process of data write-in, all resistive elements of the memory cell array are reset to a high resistance state, or the initial state, and the method is configured to execute:

a first step setting only resistive elements corresponded to the data to a low resistance state; and a second step resetting all resistive elements to a high resistance state, or the initial state.

* * * * *